US008199940B2

(12) United States Patent
Yokota

(10) Patent No.: US 8,199,940 B2
(45) Date of Patent: Jun. 12, 2012

(54) AUDIO REPRODUCTION SYSTEM AND SPEAKER APPARATUS

(75) Inventor: Teppei Yokota, Chiba (JP)

(73) Assignee: Sony Corporation, Tokyo (JP)

( * ) Notice: Subject to any disclaimer, the term of this patent is extended or adjusted under 35 U.S.C. 154(b) by 1101 days.

(21) Appl. No.: 12/080,942

(22) Filed: Apr. 7, 2008

(65) Prior Publication Data

US 2008/0292121 A1 Nov. 27, 2008

(30) Foreign Application Priority Data

Apr. 16, 2007 (JP) ................................. 2007-106743

(51) Int. Cl.
*H04R 1/02* (2006.01)
*H04R 5/00* (2006.01)
*H04R 5/02* (2006.01)
*H03B 29/00* (2006.01)

(52) U.S. Cl. ........... 381/301; 381/1; 381/71.4; 381/302; 381/307; 381/309; 381/386

(58) Field of Classification Search .................. 381/301, 381/302, 307, 309, 386
See application file for complete search history.

(56) References Cited

U.S. PATENT DOCUMENTS

| | | | | |
|---|---|---|---|---|
| 3,115,947 | A * | 12/1963 | Wood | 181/172 |
| 3,824,343 | A * | 7/1974 | Dahlquist | 381/335 |
| 3,870,834 | A * | 3/1975 | Yeaple | 381/301 |
| 4,594,729 | A * | 6/1986 | Weingartner | 381/18 |
| 4,696,037 | A * | 9/1987 | Fierens | 381/300 |
| 4,819,269 | A * | 4/1989 | Klayman | 381/307 |
| 5,282,251 | A * | 1/1994 | Petersen | 381/333 |
| 6,075,868 | A * | 6/2000 | Goldfarb et al. | 381/301 |
| 6,154,549 | A * | 11/2000 | Arnold et al. | 381/104 |
| 6,625,289 | B1 * | 9/2003 | Oliemuller | 381/182 |
| 7,336,792 | B2 * | 2/2008 | Sasaki | 381/17 |
| 7,722,116 | B2 * | 5/2010 | Takada et al. | 297/217.4 |
| 2001/0031052 | A1 * | 10/2001 | Lock et al. | 381/71.7 |
| 2002/0076059 | A1 * | 6/2002 | Joynes | 381/71.6 |
| 2003/0099369 | A1 * | 5/2003 | Cheng | 381/309 |
| 2003/0103636 | A1 * | 6/2003 | Arai et al. | 381/302 |
| 2006/0269068 | A1 * | 11/2006 | Yokota | 381/1 |
| 2007/0183617 | A1 * | 8/2007 | Yokota et al. | 381/386 |
| 2007/0195964 | A1 * | 8/2007 | Yokota | 381/26 |
| 2008/0187156 | A1 * | 8/2008 | Yokota | 381/307 |

(Continued)

FOREIGN PATENT DOCUMENTS

CN 1419796 A 5/2003

(Continued)

*Primary Examiner* — Elvin G Enad
*Assistant Examiner* — Christina Russell
(74) *Attorney, Agent, or Firm* — Wolf, Greenfield & Sacks, P.C.

(57) ABSTRACT

An audio reproduction system includes: a first speaker arranged near a listener and behind a head of the listener with a speaker unit being held by first holding means to make it possible to mix sounds emitted from front and rear of a vibration plate of the speaker; second and third speakers held by second holding means and arranged near the listener and on left and right of the first speaker; separating means for separating and obtaining low-frequency components and medium- and high-frequency components for left and right channels from an input audio signal; means for supplying the low-frequency components separated by the separating means to the first speaker; and means for supplying the medium- and high-frequency components for the left and right channels separated by the separating means to the second and third speakers.

17 Claims, 13 Drawing Sheets

U.S. PATENT DOCUMENTS

2008/0260174 A1* 10/2008 Yokota .......................... 381/71.4

FOREIGN PATENT DOCUMENTS

| | | | | |
|---|---|---|---|---|
| DE | 19505031 | A1 | * | 8/1996 |
| EP | 1137319 | A3 | | 7/2003 |
| EP | 1439509 | A3 | | 7/2004 |
| FR | 2859863 | A1 | | 3/2005 |
| GB | 2426169 | A | | 5/2005 |
| JP | 03-069466 | U | | 7/1991 |
| JP | 03-235498 | A | | 10/1991 |
| JP | 05-095591 | | | 4/1993 |
| JP | 05-191342 | A | | 7/1993 |
| JP | 09-284883 | A | | 10/1997 |
| JP | 09-327099 | A | | 12/1997 |
| JP | 10-014000 | A | | 1/1998 |
| JP | 10-224900 | A | | 8/1998 |
| JP | 10-243500 | A | | 9/1998 |
| JP | 2001-078288 | A | | 3/2001 |
| JP | 2001-268700 | A | | 9/2001 |
| JP | 2002-269916 | A | | 9/2002 |
| JP | 2002-291100 | A | | 10/2002 |
| JP | 2004-135023 | A | | 4/2004 |
| JP | 2004-187300 | A | | 7/2004 |
| JP | 2004-289762 | A | | 10/2004 |
| JP | 2004-357075 | A | | 12/2004 |
| JP | 2005-045533 | A | | 2/2005 |
| JP | 2005045533 | A | * | 2/2005 |
| JP | 2005124106 | A | * | 5/2005 |
| JP | 2005-280580 | A | | 10/2005 |
| JP | 2006-245477 | A | | 9/2006 |
| JP | 2006273164 | A | * | 10/2006 |
| JP | 2006-345477 | A | | 12/2006 |
| JP | 2006-345480 | A | | 12/2006 |
| JP | 2007-001507 | A | | 1/2007 |
| JP | 2007003994 | A | * | 1/2007 |
| JP | 2007053622 | A | * | 3/2007 |
| JP | 2007-195092 | A | | 8/2007 |
| WO | WO 2006/109389 | A1 | | 10/2006 |

* cited by examiner

AUDIO REPRODUCTION SYSTEM AND SPEAKER APPARATUS

CROSS-REFERENCES TO RELATED APPLICATIONS

The present invention contains subject matter related to Japanese Patent Application JP 2007-106743 filed in the Japanese Patent Office on Apr. 16, 2007, the entire contents of which being incorporated herein by reference.

BACKGROUND OF THE INVENTION

1. Field of the Invention

The present invention relates to an audio reproduction system.

2. Description of the Related Art

A video audio reproduction system called a home theater system is spreading. In the video audio reproduction system, for example, video reproduction from a DVD (Digital Versatile Disc) is performed by displaying a video on a relatively large-screen display and a multi-channel surround audio system is adopted and, recently, a 5.1-channel system is adopted for audio reproduction. This makes it possible to realize powerful video and audio reproduction.

In the audio reproduction system of the 5.1-channel system, four kinds of speakers are necessary: a speaker in front of a listener (hereinafter referred to as "front"), a speaker right in front of the listener (hereinafter referred to as "center"), a speaker behind the listener (hereinafter referred to as "rear"), and a speaker exclusively used for low frequencies. A subwoofer, which is a speaker exclusively used for low frequencies, monaurally covers bands equal to or lower than 100 Hz. The other speakers cover bands from 100 Hz to 20 kHz.

In the past, as a speaker arrangement in the audio reproduction system of the 5.1-channel system, a speaker for a front left channel, a speaker for a front right channel, and a speaker for a center channel are arranged on the left side, the right side, and the front of the listener, respectively. A speaker for a rear left channel and a speaker for a rear right channel are arranged on the left side and the right side behind the listener, respectively. A subwoofer speaker for an LFE (Low Frequency Effect) channel (exclusively used for low frequencies) is arranged in an appropriate position.

These six speakers are attached to speaker boxes and arranged in the respective positions, respectively. Usually, a distance between the six speakers in the front and rear and the listener is set to, for example, about 2 meters.

In the audio reproduction system in the past, for example, speaker boxes with a capacity of about 15 liters used for speakers for front left and right channels are changed to small boxes with a capacity of about 1 liter. The speakers are also called satellite speakers. Naturally, the speakers do not cover low frequencies. Therefore, one speaker exclusively used for low frequencies called a subwoofer is added to supplement the speakers. When the speakers other than the subwoofer are speakers of small boxes in this way, a crossover frequency of an audio signal supplied to the subwoofer is often as high as 150 Hz, which is slightly higher than 100 Hz described above. However, this is still a fairly low frequency.

In a speaker system including the speakers arranged as described above, when a 5.1-channel audio signal from a DVD is reproduced, naturally, bass is reproduced sufficiently. Moreover, since the channel is specially provided on the reproduction side exclusively used for low frequencies, unprecedented heavy bass echoes around a room from a source such as a movie. As a result, powerful realistic sensations can be obtained.

However, in a relatively small room in a house, it is difficult to secure a space for arranging the six speakers for reproducing multi-channel surround sound and noise due to sound leakage to the outside occurs.

In the usual 5.1-channel speaker configuration, in order to reproduce powerful sound in DVD video audio entertainment, sound volume equal to or higher than 90 dB is necessary. Therefore, when a listener attempts to satisfactorily obtain a multi-channel surround effect, the listener needs to take into account the noise to the outside.

In this case, in general, since high-frequency sound is easily insulated, it is possible to considerably attenuate the sound with a wall or one door. However, in the case of low-frequency sound such as sound at a frequency equal to or lower than 100 Hz, sound insulation is not easy. In the relatively small room of the house, a size of the room enough for insulating the low-frequency sound is often not secured. In particular, bass such as that at frequencies 50 Hz and 40 Hz covered by the subwoofer echoes and is propagated to a considerably large range.

Therefore, when sound is reproduced from the subwoofer, it is likely that the sound reaches not only the next room but also rooms above and below and disturbs residents in the rooms. In particular, it is more difficult to insulate sound at lower frequencies. The user of the subwoofer is a significant problem in the housing situation in the metropolitan region. Therefore, the valuable 5.1-channel audio reproduction system may not be able to be fully utilized under the present situation.

When the audio reproduction system is set in an automobile, the sound at low frequencies often poses a problem.

In order to solve the problem, JP-A-5-95591 proposes a sound reproduction system that reproduces medium and high registers with a small speaker (a speaker unit of which is housed in a speaker box) and reproduces low register near the ears of a listener with headphones for low register or bone conduction.

According to the technique disclosed in JP-A-5-95591, since low register is reproduced near the ears of the listener by the headphones or the bone conduction, even if the listener hears the sound at large volume, it is possible to prevent the sound from being transmitted to the house next door.

SUMMARY OF THE INVENTION

However, in the invention disclosed in JP-A-5-95591, even if sound at a low frequency is reproduced near the ears, the headphones or a vibration member employing bone conduction is used instead of the speaker. A sense of a low frequency realized by the vibration member other than the speaker does not seem to be straightly accepted by general listeners, although depending on individual differences. Further, since a listener has to wear the headphones or a headset for bone conduction, the listener is annoyed.

Moreover, in the invention of JP-A-5-95591, the problem of noise due to low-frequency sound is reduced. However, the problem in that many speakers have to be arranged in a small space is not solved by the invention of JP-A-5-95591.

When many speakers such as six speakers are arranged, plural listeners may desire to simultaneously enjoy reproduced sound. In such a case, depending on listening positions of the respective listeners with respect to arrangement positions of the speakers, the listeners may not be able to listen to left and right channels and the like as expected sound.

Therefore, it is desirable to provide an audio reproduction system that can reduce propagation of sound to the house next door and a surrounding environment even if the sound is reproduced at large volume and allows respective listeners to obtain satisfactory reproduced sound fields.

According to an embodiment of the present invention, there is provided an audio reproduction system including:

a first speaker arranged near a listener and behind the head of the listener with a speaker unit being held by first holding means to make it possible to mix sounds emitted from the front and rear of a vibration plate of the speaker;

second and third speakers held by second holding means and arranged near the listener and on the left and right of the first speaker;

separating means for separating and obtaining low-frequency components and medium- and high-frequency components for left and right channels from an input audio signal;

means for supplying the low-frequency components separated by the separating means to the first speaker; and means for supplying the medium- and high-frequency components for the left and right channels separated by the separating means to the second and third speakers.

According to the embodiment of the present invention, since the first speaker is held near the listener, even if the first speaker is not sounded at large volume, it is easy to cause the listener to listen to the sound at large volume.

Since the speaker unit of the first speaker is not attached to the baffle plate, reproduced sound is emitted from the front and rear of the vibration plate of the speaker. Sounds emitted from the front and rear of the vibration plate of the speaker have phases opposite to each other (opposite phases). Therefore, the sounds propagating to the outside cancel each other to be attenuated. In particular, since a wavelength of a sound wave is longer at lower frequencies, the attenuation is larger at the lower frequencies. Therefore, according to the embodiment, low-frequency sound is extremely reduced.

According to the embodiment of the present invention, the second and third speakers are arranged on the left and right of the first speaker. However, since the second and third speakers are speakers for medium and high frequencies, the speakers can be small speakers and can be arranged near the respective listeners together with the first speakers. Therefore, the respective listeners can obtain satisfactory reproduced sound fields.

With the audio reproduction system according to the embodiment of the present invention, it is possible to reduce low-frequency reproduced sound that causes the problem of noise to the neighborhood and the respective listeners can obtain satisfactory reproduced sound fields.

DESCRIPTION OF THE PREFERRED EMBODIMENTS

Embodiments of the present invention will be hereinafter explained with reference to the accompanying drawings.

First Embodiment

An audio reproduction system according to the first embodiment is an example in performing video monitoring and 5.1-channel surround sound listening using a video signal and an audio signal reproduced by a DVD player and using a digital broadcast signal received by a television receiver.

Figure 1:
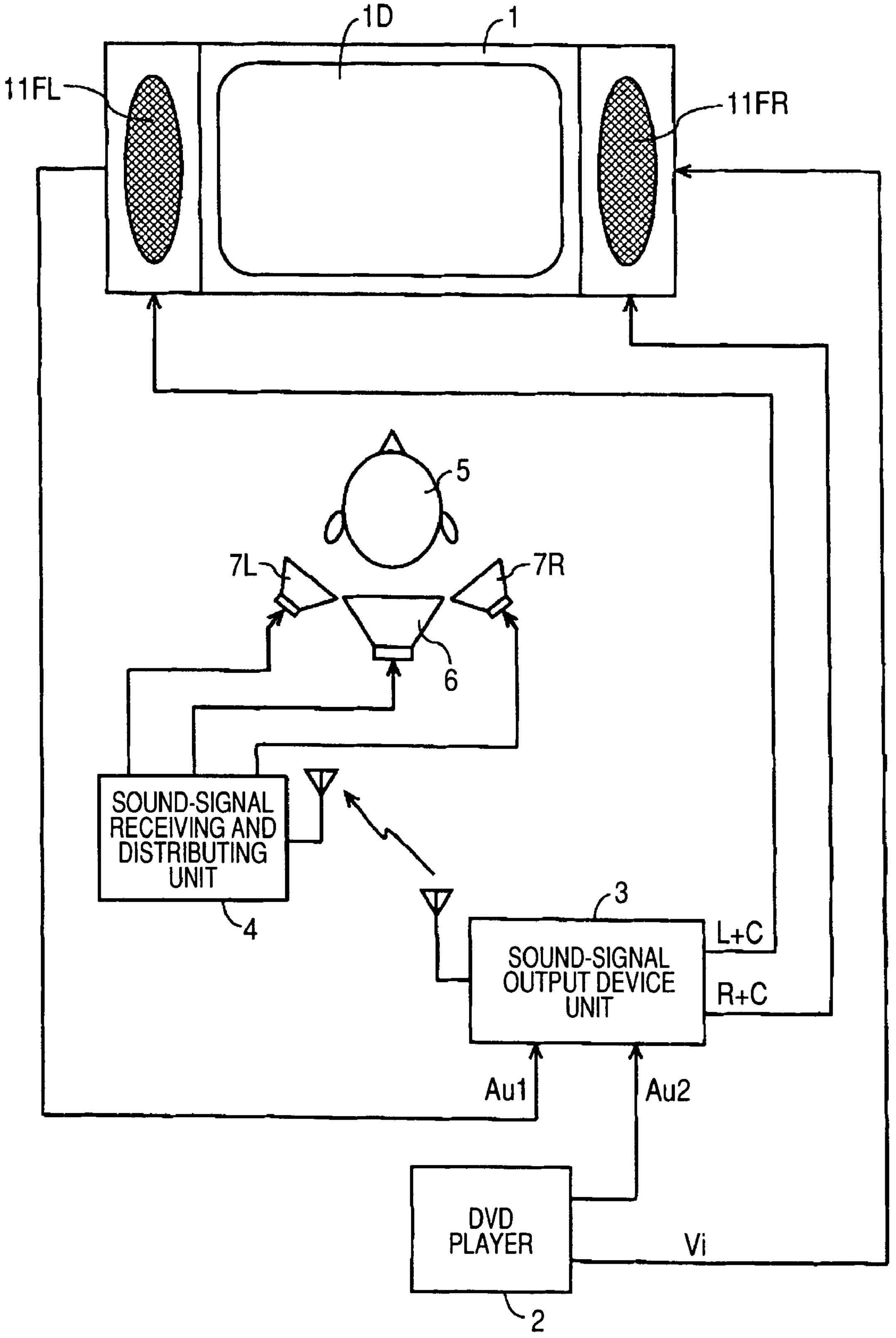
FIG. 1 is a diagram for explaining an example of the schematic structure of an audio reproduction system according to a first embodiment of the present invention.

FIG. 1 is a diagram schematically showing an audio reproduction system according to the first embodiment.

As shown in FIG. 1, the audio reproduction system according to the first embodiment includes a television receiver 1 as a video monitor apparatus incorporating a television tuner and including two speakers 11FL and 11FR, a DVD player 2, an audio-signal output device unit 3, an audio-signal receiving and distributing unit 4, and a first speaker 6 and second and third speakers 7L and 7R provided near a listener 5 and behind the head of the listener 5. The audio-signal receiving and distributing unit 4 alone is also an audio reproduction system according to an embodiment of the present invention.

The first speaker 6 is a speaker for low frequencies. In this embodiment, the first speaker 6 is arranged behind the substantial center of the head of the listener 5. The first speaker 6 is not brought into direct contact with the head and the ears of the listener 5. The second and third speakers 7L and 7R are speakers for medium and higher frequencies. In this embodiment, the second and third speakers 7L and 7R are arranged on both sides of the speaker 6 for low frequencies with sound emitting direction thereof directed in directions of the left and right ears of the listener 5, respectively.

In the first embodiment, as speakers for reproducing sound in front left and right two channels in 5.1-channel surround sound, the two speakers 11FL and 11FR of the television receiver 1 are used. The two speakers 11FL and 11FR may be built in the television receiver 1 or may be independently provided separately from the television receiver 1.

In the first embodiment, as described later, in addition to a low-frequency audio signal LFE, audio signals of rear left and right two channel sound in the 5.1-channel surround sound are subjected to virtual sound source processing in the audio-signal output device unit 3 and supplied to the three speakers 6, 7L, and 7R arranged near and behind the listener 5.

The television receiver 1 includes a tuner that can receive a digital broadcast signal. The television receiver 1 reproduces a video signal and an audio signal of a digital broadcast program from a received digital broadcast signal, displays a reproduced video of the digital broadcast program on a display screen 1D of the television receiver 1, and reproduces a reproduced sound of a digital broadcast program using the speakers 11FL and 11FR.

In this case, when sound of the digital broadcast program is multi-channel surround sound, in the reproduced sound of the digital broadcast program emitted from the speakers 11FL and 11FR, sound in the center channel, sound in the rear left and right two channels, and the like are included in sound in the front left and right two channels.

In this embodiment, an audio signal Au1 received and reproduced by the television receiver 1 is supplied to the audio-signal output device unit 3.

The DVD player 2 reproduces and outputs a video signal and an audio signal recorded in a DVD. In this embodiment, a video signal Vi reproduced by the DVD player 2 is supplied to the television receiver 1. A reproduced video formed by the reproduced video signal Vi is displayed on a DVD player display screen 1D. In this embodiment, an audio signal Au2 reproduced by the DVD player 2 is supplied to the audio-signal output device unit 3.

In this embodiment, the audio-signal output device unit 3 has a decoding function corresponding to a multi-channel surround sound system for the 5.1 channel. When sound of the digital broadcast program received by the television receiver 1 is reproduced as 5.1-channel surround sound, the audio-signal output device unit 3 generates an audio signal supplied to the first to third speakers 6, 7L, and 7R provided near both the ears of the listener 5 and behind the head of the listener 5. The audio-signal output device unit 3 multiplexes the generated audio signal supplied to the first to third speakers 6, 7L, and 7R. In this embodiment, the audio-signal output device unit 3 transmits the audio signal to the audio-signal receiving and distributing unit 4 by radio using a radio wave.

The audio-signal receiving and distributing unit 4 receives the radio wave from the audio-signal output device unit 3, extracts the multiplexed audio signal from the received radio wave. The audio-signal receiving and distributing unit 4 separates an audio signal supplied to the first speaker 6 and audio signals supplied to the second and third speakers 7L and 7R using demultiplex and bandsplitting and supplies the audio signals to the first speaker 6 and the second and third speakers 7L and 7R, respectively.

The radio transmission from the audio-signal output device unit 3 to the audio-signal receiving and distributing unit 4 is not limited to transmission by the radio wave. Ultrasound and light may be used.

In reproducing a video and sound reproduced by the DVD player 2, the audio-signal output device unit 3 generates not only an audio signal supplied to the three speakers 6, 7L, and 7R provided near both the ears of the listener 5 and behind the head of the listener 5 but also an audio signal supplied to the two speakers 11FL and 11FR for the left and right two channels of the television receiver 1. The audio-signal output device unit 3 supplies the audio signals to the speakers 11FL and 11FR corresponding to the audio signals, respectively.

In the first embodiment, the audio-signal output device unit 3 supplies a sum signal of an audio signal L in a front left channel and an audio signal C in a center channel and a sum signal of an audio signal R in a front right channel and the audio signal C in the center channel to the two speakers 11FL and 11FR for the left and right two channels of the television receiver 1.

The audio-signal output device unit 3 supplies a low-frequency component of a sum signal of an audio signal RL* and a low-frequency audio signal LFE in rear left and right channels subjected to so-called virtual sound source processing described later, a medium- and high-frequency components of a sum signal of an audio signal RL* and the low-frequency audio signal LFE in the rear left channel subjected to the virtual sound source processing, and medium- and high-frequency components of a sum signal of an audio signal RR* and the low-frequency audio signal LFE in the rear right channel subjected to the virtual sound source processing to the three speakers 6, 7L, and 7R near the listener 5 and behind the head, respectively.

Example of a speaker arrangement according to the first Embodiment.

An example of a speaker arrangement in the audio reproduction system according to the first embodiment explained above is explained with reference to FIG. 2.

Figure 2:
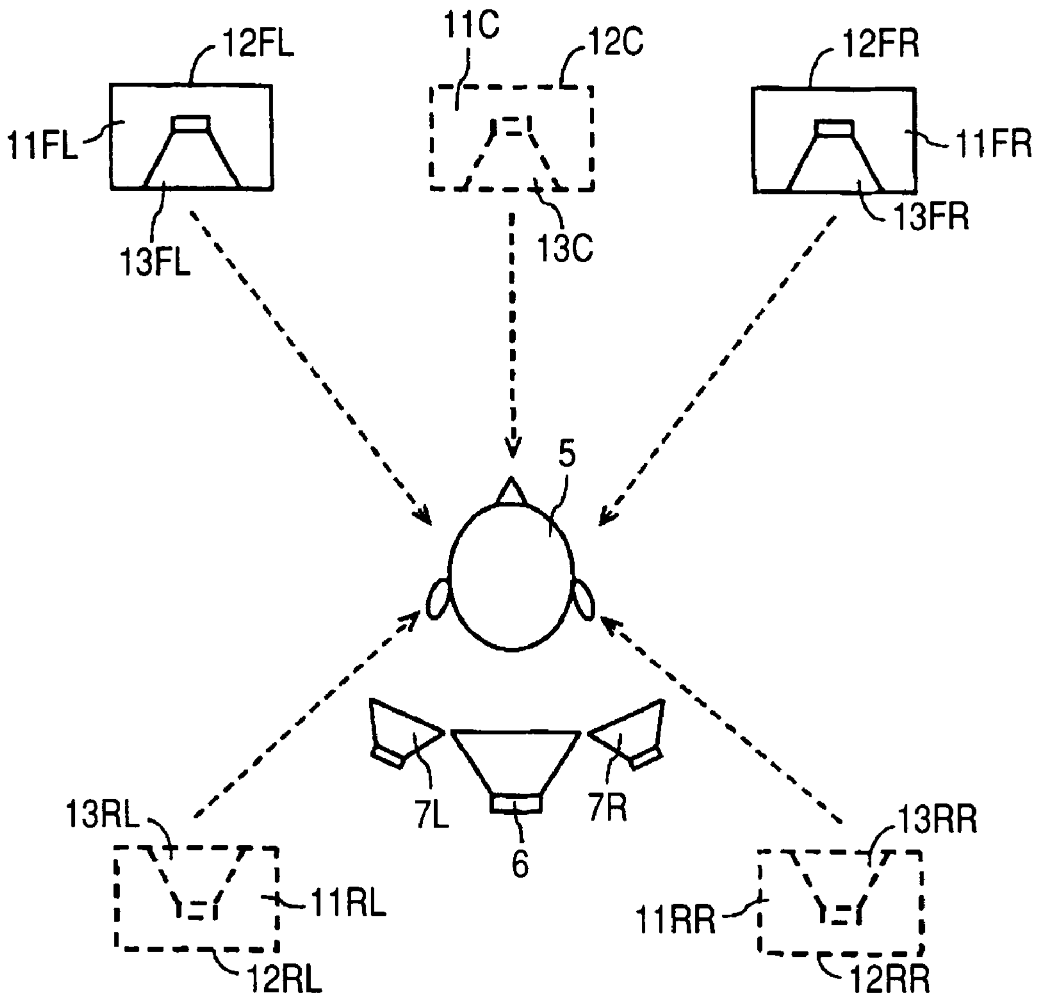
FIG. 2 is a diagram for explaining an example of a speaker arrangement in the audio reproduction system according to the first embodiment.

As shown in FIG. 2, in this embodiment, the speaker 11FL for the front left channel and the speaker 11FR for the front right channel are arranged on the left side and the right side in front of the listener 5, respectively.

In this example, these speakers 11FL and 11FR are built in the television receiver 1. Therefore, a front side of speaker boxes 12FL and 12FR (e.g., a front panel of the television receiver 1) is used as a baffle plate. Speaker units 13FL and 13FR for the speakers 11FL and 11FR are attached to the baffle plate. These speakers 11FL and 11FR are referred to as front speakers when it is unnecessary to distinguish the channels.

In this embodiment, the three speakers 6, 7L, and 7R are arranged near the left and right ears of the listener 5 and behind the head. The speaker 6 is a speaker for low frequencies. In this embodiment, an elliptical speaker having a relatively large aperture is used as the speaker 6. The speaker 6 is arranged behind the center of the head of the listener 5 (right behind the head). The speaker 6 is configured as a so-called bare speaker in which a speaker unit thereof is not housed in a speaker box and is not attached to a baffle plate to make it possible to mix sounds emitted from the front and rear of a vibration plate of the speaker.

The speakers 7L and 7R are speakers for medium and high frequencies and having an aperture smaller than that of the speaker 6. The speakers 7L and 7R are arranged on both the left and right side of the speaker 6 such that vibration plates thereof are opposed to the left and right ears of the listener 5, respectively, from behind the head of the listener 5. In this case, like the speaker 6, the speakers 7L and 7R are configured as bare speakers not attached to baffle plates. However, the speakers 7L and 7R for medium and high frequencies may be attached to baffle plates and housed in speaker boxes.

In this embodiment, the low-frequency component of the sum signal of the audio signal RL* and the low-frequency audio signal LFE of the rear left and right channels subjected to the virtual sound source processing is supplied to the speaker 6 arranged in the center behind the head near the listener 5. Low-frequency sound is emitted from the speaker 6. Therefore, in this embodiment, the speaker 6 plays a function equivalent to that of a subwoofer.

Consequently, low-frequency sound in the LFE channel is emitted near the ears of the listener 5 by the speaker 6 behind the head of the listener 5. Therefore, the listener 5 listens to the sound at large volume. However, in a position apart from the listener 5, sounds emitted from the front and rear of the speaker unit of the speaker 6 have phases different 180 degrees from each other and cancel each other. Therefore, the listener 5 hardly hears the sounds. Therefore, it is possible to prevent a situation in which, as in the past, low-frequency sound is propagated to the neighborhood such as the house next door and causes trouble.

Figure 3:
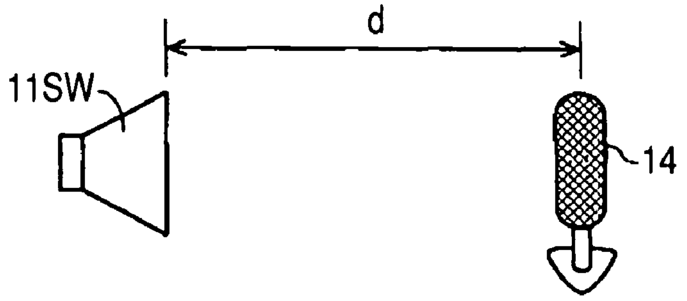
FIG. 3 is a diagram for explaining an example of a speaker arrangement in the audio reproduction system according to the first embodiment.

In order to check attenuation of low-frequency sound, as shown in FIG. 3, in an anechoic room, sound from a speaker unit 11SW having an aperture of, for example, 17 centimeters for a subwoofer was collected by a microphone 14 in a position a distance "d" apart from a speaker unit 11SW and a frequency characteristic of a sound pressure level thereof was measured. Then, a result shown in FIG. 4 was obtained. In this case, the speaker unit 11SW was not housed in a box and attached to a baffle plate.

Figure 4:
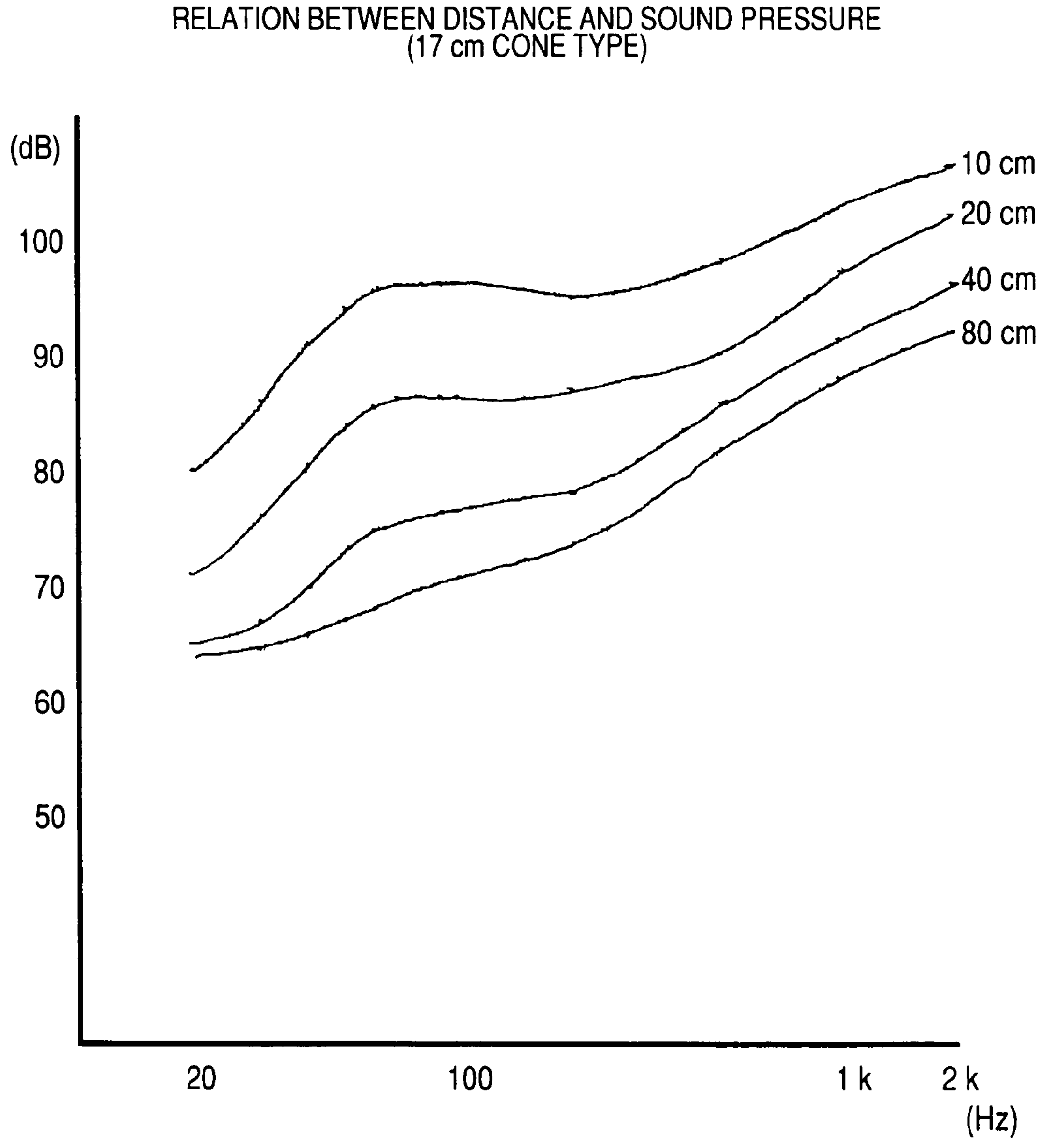
FIG. 4 is a graph for explaining an operation of the audio reproduction system according to the first embodiment.

Four frequency characteristic curves shown in FIG. 4 are those at the time when the distance "d" between the speaker unit 11SW and the microphone 14 is 10 centimeters, 20 centimeters, 40 centimeters, and 80 centimeters, respectively.

It is seen from FIG. 4 that when a speaker unit is configured as a bare speaker not housed in a box, sound equal to or lower than 1 kHz is substantially attenuated. It is confirmed that, in particular, an attenuation amount of lower-frequency sound is larger.

In the case of this embodiment, a distance dsw between the speaker 6 and the left ear and the right ear of the listener 5 is set to a distance in which low-frequency sound is transmitted to the ears of the listener 5 without being substantially attenuated, i.e., about 20 centimeters in this example.

For example, whereas a distance between the speaker 6 and the ears of the listener 5 is 2 meters in a general configuration in the past, in this embodiment, the distance between the speaker 6 and the ears of the listener 5 is set to 20 centimeters. In the case of this embodiment, the distance is 1/10 compared with that in the past.

Therefore, in this embodiment, energy necessary for allowing the listener 5 to feel a sound pressure same as that in the past only has to be 1/100 of that in the general configuration in the past. In other words, if a 100 W (watt) amplifier is necessary in the general example described above, in the case of this embodiment, the listener 5 feels the same sound pressure even with a 1 W amplifier.

In this embodiment, diffusion of sound is small because of only a difference in an audio signal output supplied to the speaker. Moreover, low-frequency sound, for example, sound at 20 Hz, 30 Hz, and 40 Hz, is cancelled in terms of a phase. The sound is rarely heard except the limited vicinity of the speaker unit of the speaker 6 that plays a role of a subwoofer. On the other hand, a powerful acoustic effect included in DVD software is obtained by collecting large energy in this bass band. Therefore, the effect of noise insulation is further improved.

With the configuration described above, when attenuation of only the low-frequency sound is considered paying attention to only the low-frequency sound, the effect is sufficiently obtained.

In the case of 5.1-channel surround sound, moreover, there are sound in the center channel and sound in the rear left and right two channels. In the past, as indicated by a dotted line in front of the listener 5 in FIG. 2, in a speaker 11C for sound in the center channel, a speaker unit 13C is attached to a speaker box 12C with a front side thereof as a baffle plate. The speaker 11C is arranged on a front side of the listener 5 as shown in the figure.

However, in this embodiment, the sound in center channel is reproduced by being equally distributed and supplied to the two speakers 11FL and 11FR of the television receiver 1 without providing the speaker 11C exclusively used for the sound. In other words, the audio signal C in the center channel is added to the audio signals L and R in the front left and right two channels, supplied to the speakers 11FL and 11FR, respectively, and reproduced by the speakers 11FL and 11FR.

Similarly, in the past, as indicated by a dotted line behind the listener 5 in FIG. 2, in speakers 11RL and 11RR for sound in the rear left and right two channels, rear speaker units 13RL and 13RR attached to small speaker boxes 12RL and 12RR with front sides thereof as baffle plates are arranged.

However, in this embodiment, sound in the rear left and right two channels is reproduced by the two speakers 7L and 7R near both the ears of the listener 5. An audio signal RL in the rear left channel is converted into an audio signal RL* by the virtual sound source processing, supplied to the speaker 7L opposed to the left ear behind the listener 5, and reproduced. An audio signal RR in the rear right channel is converted in to an audio signal RR* by the virtual sound source processing, supplied to the speaker 7R opposed to the right ear behind the listener 5, and reproduced.

Like the speaker 6, a distance from the speakers 7L and 7R to the ears of the listener 5 is small. Therefore, concerning the audio signals RL and RR in the rear left and right two channels, it is also possible to reduce radiation energy in registers thereof and contribute to noise insulation.

When sound in the rear left and right two channels subjected to the virtual sound source processing is reproduced by the speakers 7L and 7R arranged near the ears behind the listener 5, localization positions of the speakers 7L and 7R are not so important because reverberant sound and the like from the back of the listener 5 are originally main sound sources of the sound in the rear left and right two channels. Therefore, there is an effect that it is possible to obtain satisfactory surround sound while realizing a reduction in the number of speakers and low noise.

As an example of a speaker arrangement formed by taking into account the above, a method of setting the respective speakers in a chair such as a massage chair is conceivable.

Figure 5:
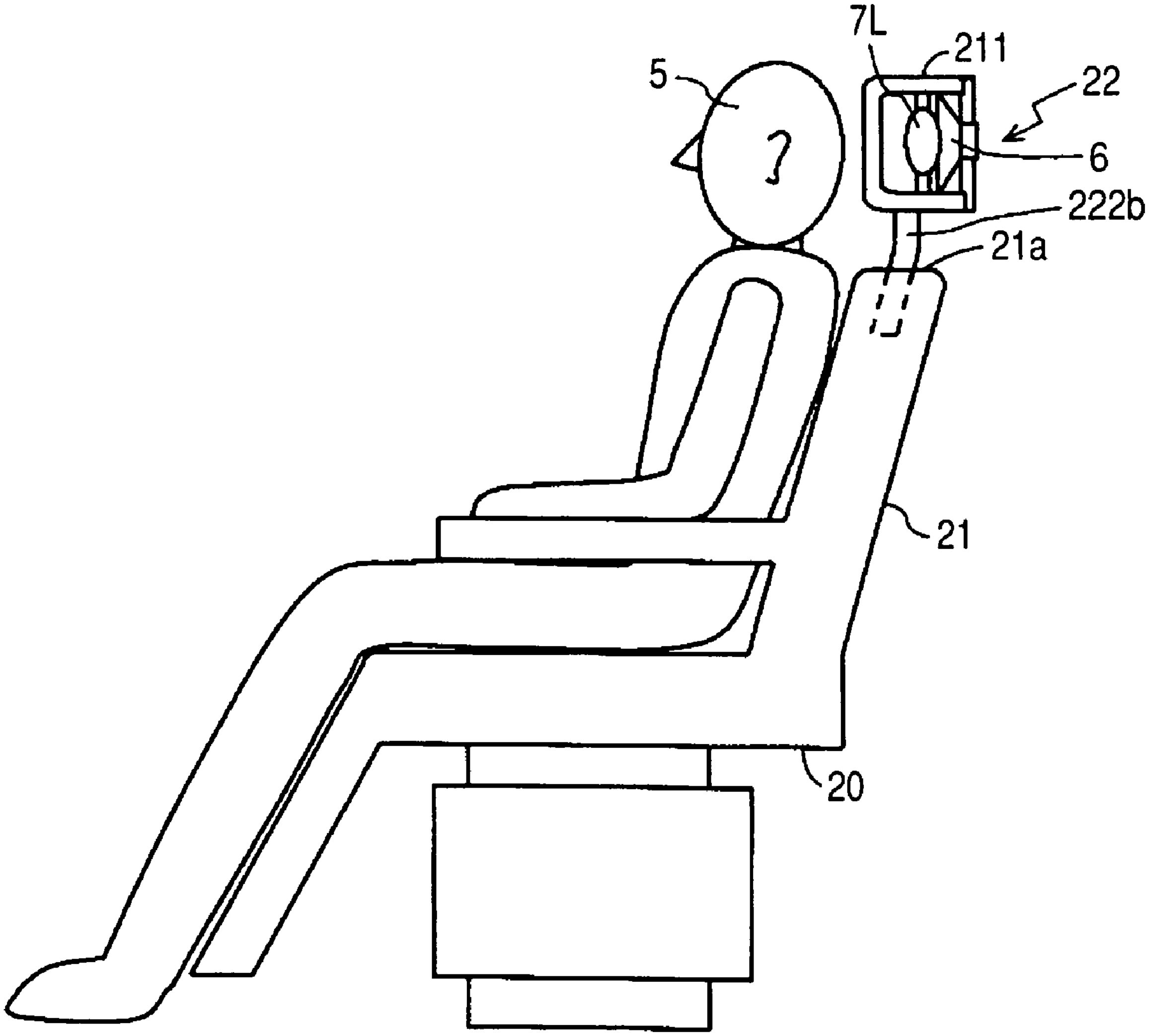
FIG. 5 is a diagram for explaining an example of a speaker arrangement in the audio reproduction system according to the first embodiment.

FIG. 5 is a diagram for explaining an example in that case. The speaker 6 that should be arranged in the center behind the head of the listener 5 and the two speakers 7L and 7R on both the sides of the speaker 6 are mounted on a top 21*a* of a chair back 21 of a chair 20.

In this example, for example, the chair 20 has the structure like a business class seat of an airplane. A speaker holder 22 is attached to the top 21*a* of the chair back 21 of the chair 20. The three speakers 6, 7L, and 7R are attached to and held by the speaker holder 22. In this example, a first holding unit configured to hold the first speaker 6 and a second holding unit configured to hold the second and third speakers are formed by one speaker holder 22.

Figure 6A:
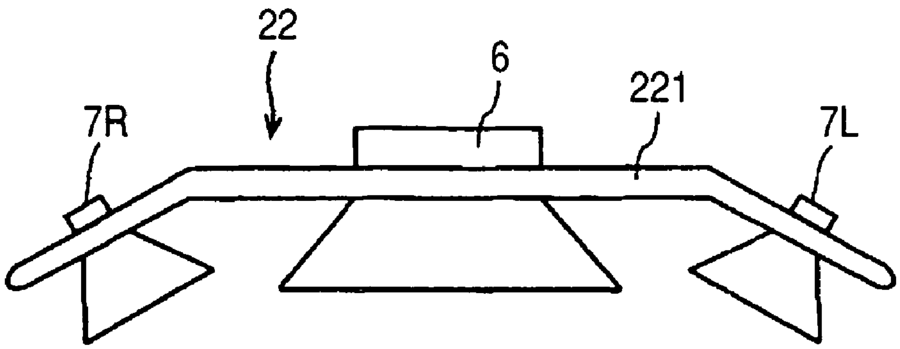
FIGS. 6A and 6B are diagrams for explaining an example of a speaker arrangement in the audio reproduction system according to the first embodiment.
Figure 6B:
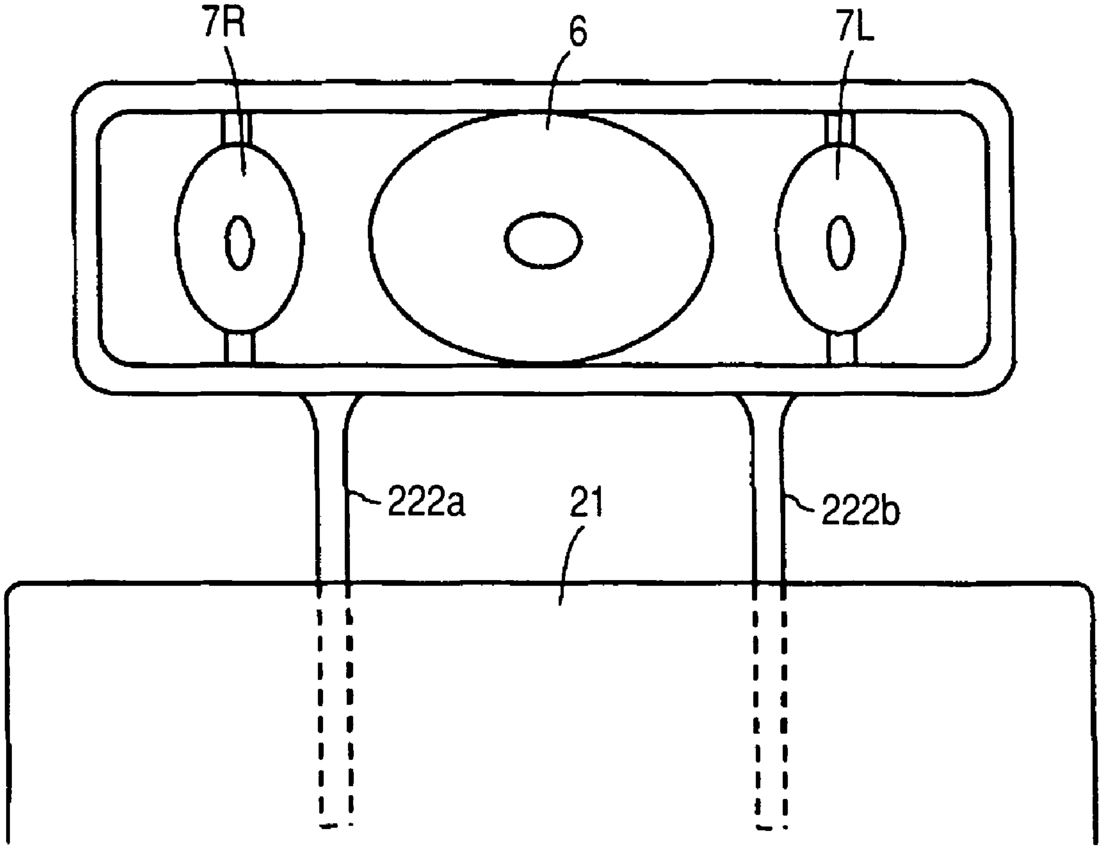

FIGS. 6A and 6B are diagrams showing an example of the speaker holder 22. The speaker holder 22 includes a pipe 221 made of metal such as aluminum. As shown in FIG. 6B, the pipe 221 is formed in a flat ring shape. The speaker 6 and the speakers 7L and 7R are fixed and held in a space formed by the ring.

The pipe 221 is formed in the flat ring shape and left and right ends of a ring shaped portion thereof are formed in a substantial U shape behind the head of the listener 5 as shown in FIG. 5. In the case of this example, in U-shaped portion of the pipe 221, attaching portions of the speakers 7L and 7R at the left and right ends thereof are slightly bent to the head side of the listener 5 such that vibration plates of the speakers 7L and 7R are opposed to the left and right ears of the listener 5.

Attaching legs 222*a* and 222*b* for attaching the ring-shaped pipe 221 to the chair back 21 of the chair 20 are coupled to the ring-shaped pipe 221. The ring-shaped pipe 221 can be, for example, removably attached to the chair back 21 of the chair 20 by the attaching legs 222*a* and 222*b*. For example, at the top 21*a* of the chair back 21 of the chair 20, long holes (not shown in the figure) in which the attaching legs 222*a* and 222*b* are inserted and fit are provided. When the attaching legs 222*a* and 222*b* are inserted and fit in the long holes of the chair back 21, the ring-shaped pipe 221 is attached and fixed.

When the listener 5 sits on the chair 20 having the ring-shaped pile 221, the speaker 6 is held in a position behind the center of the head of the listener 5 and the speakers 7L and 7R are held on both the left and right sides of the speaker 6 while being fixed to the pipe 221.

In the case of this example, when the listener 5 sits on the chair 20, a distance between the speakers 6, 7L, and 7R and the head (in particular, the ears) of the listener 5 is set to about 20 centimeters.

In this example, audio signals in channels corresponding to the respective speakers 6, 7L, and 7R are supplied from the audio-signal receiving and distributing unit 3 through signal lines (speaker cables), respectively.

Example of the Structure of the Audio-Signal Output Device Unit 3 According to the First Embodiment.

Figure 7:
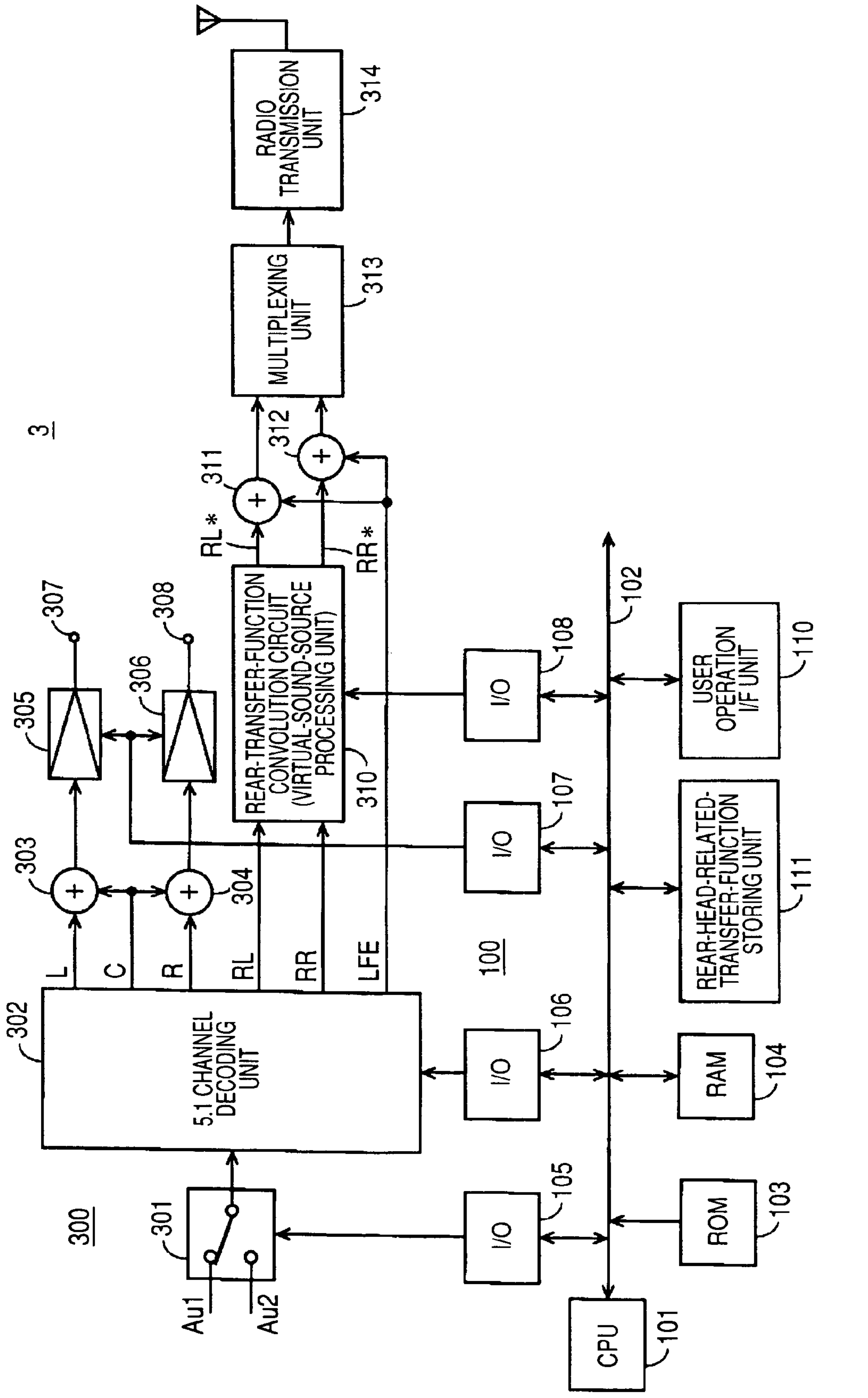
FIG. 7 is a block diagram showing an example of the structure of an audio-signal output device unit in the audio reproduction system according to the first embodiment.

FIG. 7 is a block diagram showing an example of the structure of the audio-signal output device unit 3 according to the first embodiment. The audio-signal output device unit 3 according to the first embodiment includes an audio-signal processing unit 300 and a control unit 100 including a microcomputer.

In the control unit 100, a ROM (Read Only Memory) 103 having software programs and the like stored therein, a RAM (Random Access Memory) 104 for a work area, plural input and output ports 105 to 108, a user operation interface unit 110, a rear-head-related-transfer-function (HRTF) storing unit 111, and the like are connected to a CPU (Central Processing Unit) 101 through a system bus 102. As the user operation interface unit 110, besides a key operation unit and the like directly provided in the audio-signal output device unit 3, there is an operation unit including a remote commander and a remote control receiving unit.

As described above, in this embodiment, the audio-signal output device unit 3 can receive the audio signal Au1 from the television receiver 1 and the audio signal Au2 from the DVD player 2. The received audio signals Au1 and Au2 are supplied to an input selection switch circuit 301.

The input selection switch circuit 301 is switched by a switching signal, which is supplied through the input and output port 105 of the control unit 100, according to selection operation of the listener 5 performed through the user operation interface unit 110. When sound from the television receiver 1 is selected by the listener 5, the switch circuit 301 is switched to select the audio signal Au1. When sound from the DVD player 2 is selected, the switch circuit 301 is switched to select the audio signal Au2.

The audio signal selected by the switch circuit 301 is supplied to a 5.1-channel decoding unit 302. The 5.1-channel decoding unit 302 receives the audio signal Au1 or Au2 from the switch circuit 301, subjects the audio signal to channel decode processing, and outputs the audio signals L and R in the front left and right channels, the audio signal C in the center channel, the audio signals RL and RR in the rear left and right channels, and the low-frequency audio signal LFE.

The audio signal L in the front left channel and the audio signal C in the center channel outputted from the 5.1-channel decoding unit 302 are supplied to a combining unit 303 and combined. A combined output audio signal (L+C) of the audio signals is led out to an audio output terminal 307 through an amplifier 305. An audio signal obtained at the audio output terminal 307 is supplied to one speaker 11FL of the television receiver 1.

The audio signal R in the front right channel and the audio signal C in the center channel from the 5.1-channel decoding unit 302 are supplied to a combining unit 304 and combined. A combined output audio signal (R+C) of the audio signals is led out to an audio output terminal 308 through an amplifier 306. An audio signal obtained at the output terminal 308 is supplied to the other speaker 11FR of the television receiver 1.

The amplifiers 305 and 306 have a muting function of locking an audio signal output and are subjected to muting control by a muting signal supplied through an input and output port 107 of the control unit 100.

In this embodiment, when the audio signal Au1 from the television receiver 1 is received, an audio signal reproduced by the television receiver 1 is reproduced from the speakers 11FL, and 11FR of the television receiver 1. Therefore, the amplifiers 305 and 306 are subjected to the muting control and an audio signal from the audio-signal output device unit 3 is blocked not to be supplied to the speakers 11FL and 11FR of the television receiver 1.

On the other hand, when the audio signal Au2 from the DVD player 2 is received, the amplifiers 305 and 306 are not subjected to the muting control and an audio signal from the audio-signal output device unit 3 is supplied to the speakers 11FL and 11FR of the television receiver 1.

In stead of subjecting the amplifiers 305 and 306 to the muting control, in decoding an audio signal from the television receiver 1, the 5.1-channel decoding unit 302 may not decode and output the audio signals L and R in the front left and right channels and the audio signal C in the center channel. In that case, a control signal for not decoding and outputting the audio signal C only has to be supplied through the input and output port 106.

The audio signals RL and RR in the rear left and right two channels obtained by the decoding in the 5.1-channel decoding unit 302 are supplied to a rear-transfer-function convolution circuit 310 serving as a virtual-sound-source processing unit.

The rear-transfer-function convolution circuit 310 convolutes, for example, using a digital filter, a rear head related transfer function, which is prepared in the rear-head-related-transfer-function storing unit 111 in advance, in the audio signals RL and RR in the rear left and right two channels from the 5.1-channel decoding unit 302.

Therefore, in the rear-transfer-function convolution circuit 310, when an input audio signal thereto is not a digital signal, the input audio signal is converted into a digital signal. After the rear head related transfer function is convoluted therein, the input audio signal is reset to an analog signal and outputted.

In this example, the rear head related transfer function is measured and calculated as described below and stored in the rear-head-related-transfer-function storing unit 111. FIGS.

8A and 8B are diagrams for explaining a method of measuring the rear head related transfer function.

Figure 8A:
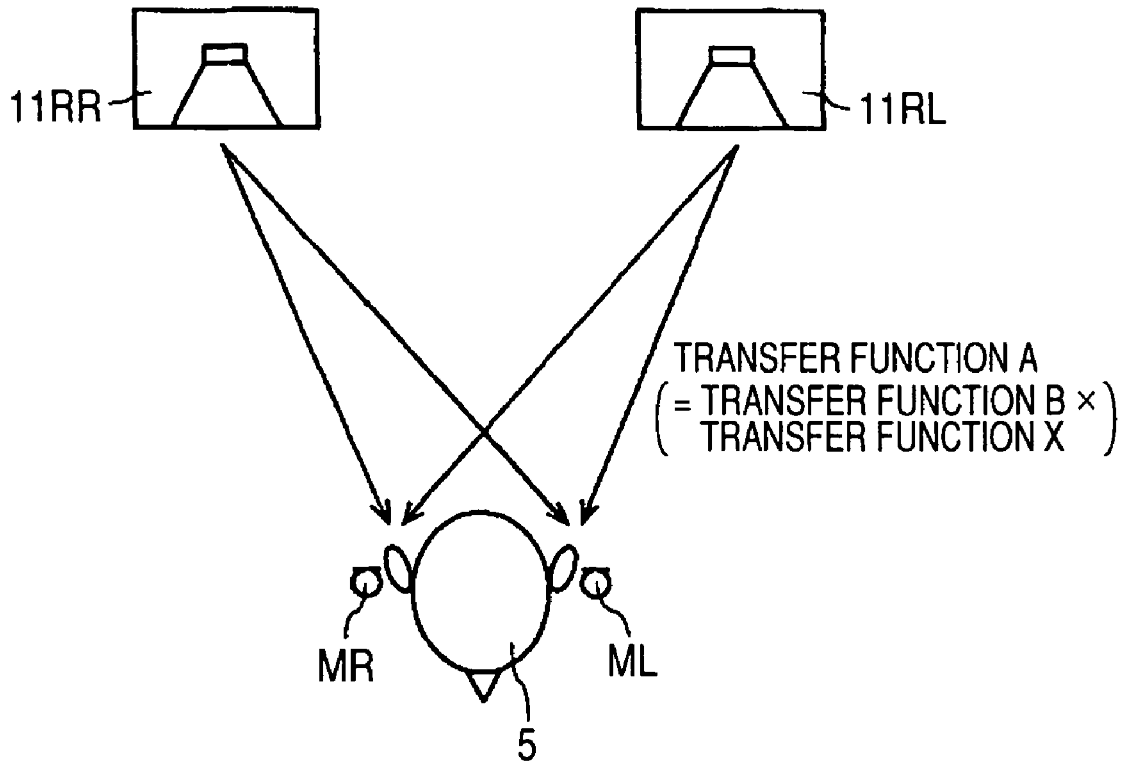
FIGS. 8A and 8B are diagrams for explaining a rear head related transfer characteristic used for virtual sound source processing.

As shown in FIG. 8A, a microphone ML for left channel measurement and a microphone MR for right channel measurement are set near both the left and right ears of the listener 5. A speaker 11RL for the rear left channel is set in a place behind the listener 5 where a speaker for the rear left channel is usually arranged. For example, emitted sound emitted when impulse is reproduced by the speaker 11RL for the rear left channel is collected by the respective microphones ML and MR.

A transfer function for transfer from the rear speaker 11RL to the left and right ears (a rear head related transfer function for the rear left channel) is measured from an audio signal of the collected sound.

In the same manner, for example, emitted sound emitted when impulse is reproduced by a speaker 11RR for the rear right channel is collected by the respective microphones ML and MR. A transfer function for transfer from the rear speaker 11RR to the left and right ears (a rear head related transfer function for the rear right channel) is measured from an audio signal of the collected sound.

It is advisable that, when the rear speakers 11RL and 11RR are set in positions at an angle of 30 degrees and a distance of 2 m to the left and right from the center behind the listener 5, a transfer function for transfer from the respective speakers to both the ears is measured and the measured transfer function is applied as the rear head related transfer function.

Figure 8B:
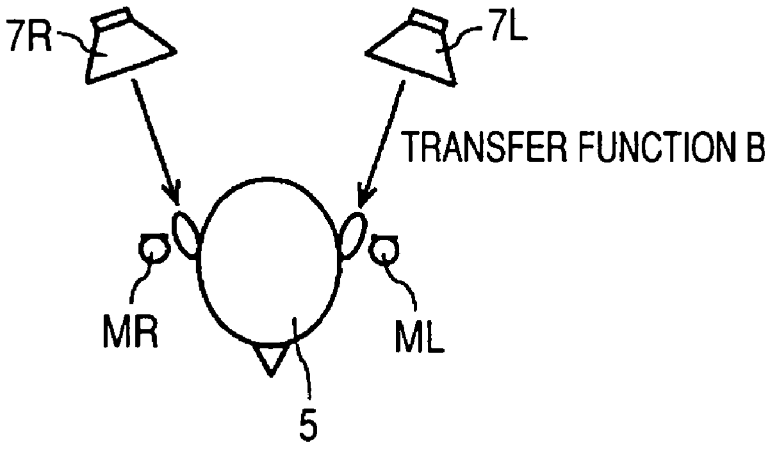

Explanation of the transfer function is further supplemented below. For example, in FIG. 8A, a transfer function for transfer from left behind to the left ear is represented as a transfer function A. As shown in FIG. 8B, a transfer function obtained by measuring a transfer function for transfer from the speaker 7L near the ears to the microphone ML is represented as a transfer function B. A transfer function X, with which the transfer function B is multiplied to obtain the transfer function A, is calculated. The calculated transfer function X is convoluted in signal sound sent to the speaker 7L near the ears. Then, the listener 5 feels as if sound emitted from the speaker 7L at that point is sound traveling from a position 2 m left behind the listener 5. Concerning the right channel, a transfer function can be calculated in the same manner.

The transfer function X does not always have to be calculated. In some case, only the transfer function A has to be calculated. One transfer function is explained above as a representative transfer function. However, it goes without saying that, as shown in FIGS. 8A and 8B, actually, there are plural transfer functions.

The rear head related transfer function measured as described above is stored in the rear-head-related-transfer-function storing unit 111, supplied to the rear-transfer-function convolution circuit 310 through the input and output port 108, and convoluted in the rear-transfer-function convolution circuit 310. Consequently, when the audio signals RL* and RR* from the rear-transfer-function convolution circuit 310 are supplied to the speakers 7L and 7R arranged near both the ears and reproduced, the listener 5 listens to reproduced sound as if the reproduced sound is emitted from the left and right rear speakers 11RL and 11RR behind the listener 5.

Levels of the audio signals RL* and RR* in the rear left and right channels subjected to the virtual sound source processing at this point may be lower than levels of the signals supplied to the speakers 11RL and 11RR. This is because the speakers 7L and 7R are provided near the ears of the listener 5.

Sound is heard as if the sound is emitted from virtual speaker positions because of the head related transfer function convolution. Therefore, in this specification, the processing described above is referred to as virtual sound source processing.

The audio signals RL* and RR* subjected to the virtual sound source processing from the rear-transfer-function convolution circuit 310 as described above are supplied to combining units 311 and 312. The low-frequency audio signal LFE from the 5.1-channel decoding unit 302 is supplied to the combining units 311 and 312.

Output audio signals of the combining units 311 and 312 are signals that should be supplied to the speakers 7L and 7R, respectively. The output audio signals of the combining units 311 and 312 are supplied to a multiplexing unit 313 and multiplexed. The multiplexed audio signals are transmitted from a radio transmission unit 314 to the audio-signal receiving and distributing unit 4 by radio.

Example of the Structure of the Audio-Signal Receiving and Distributing Unit.

Figure 9:
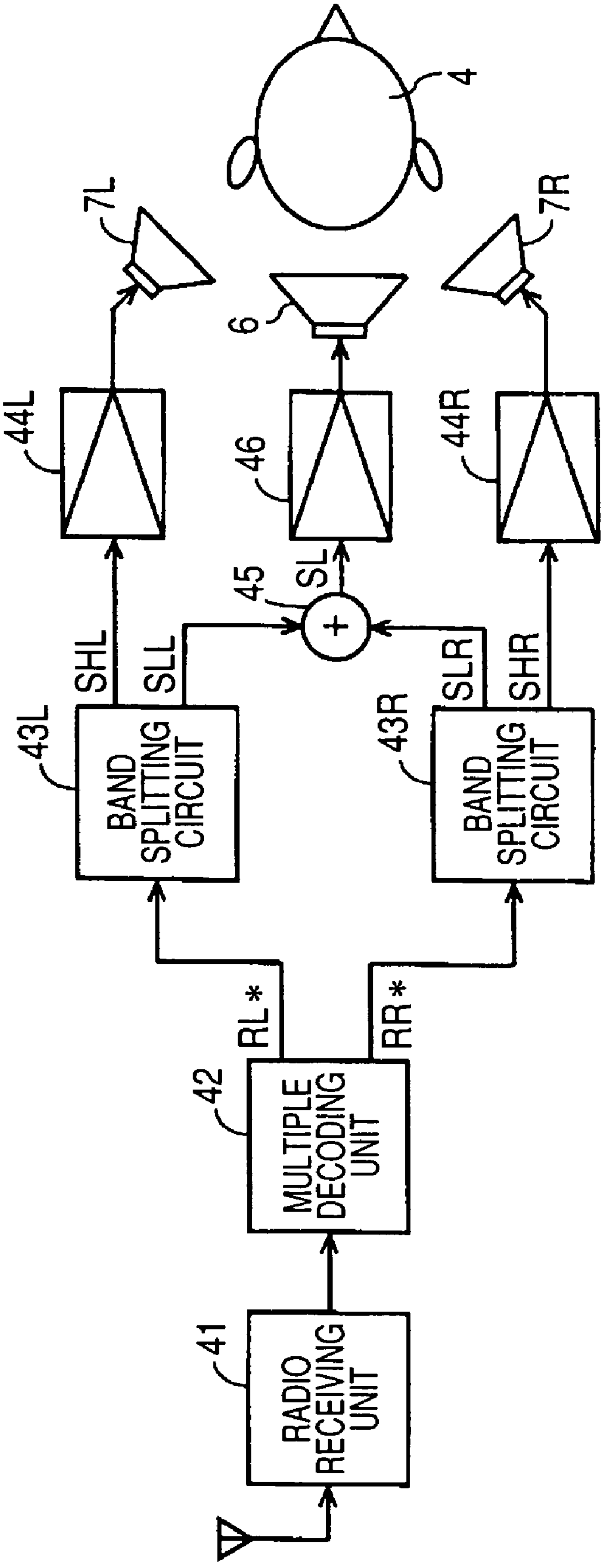
FIG. 9 is a diagram showing an example of the structure of an audio-signal receiving and distributing unit shown in FIG. 1.

In this embodiment, the audio-signal receiving and distributing unit 4 is configured as shown in FIG. 9. A signal transmitted from the audio-signal output device unit 3 by radio is received by a radio receiving unit 41 and supplied to a multiple decoding unit 42. In the multiple decoding unit 42, an audio signal multiplexed in the received signal is subjected to de-multiplex processing and the signals RL* and RR* in the two channels are decoded.

The signals RL* and RR* in the two channels from the multiple decoding unit 42 are supplied to band splitting circuits 43L and 43R, respectively. The band splitting circuits 43L and 43R respectively separate the inputted signals RL* and RR* into low-frequency components SLL and SLR and medium- and high-frequency components SHL and SHR. For example, frequency components lower than 200 Hz are set as low-frequency components and frequency components higher than 200 Hz are set as high-frequency components. This separation frequency is not limited to 200 Hz and may be, for example, 100 Hz.

The medium- and high-frequency component SHL in the left channel from the band splitting circuit 43L is supplied to the speaker 7L through an amplifier 44L. The medium- and high-frequency component SHR in the right channel from the band splitting circuit 43R is supplied to the speaker 7R through an amplifier 44R.

The low-frequency components SLL and SLR from the band splitting circuit 43L and the band splitting circuit 43R are supplied to a combiner 45 and combined. A combined output signal SL of the low-frequency components is supplied to the speaker 6 through an amplifier 46.

Therefore, the speaker 6 serving as a subwoofer mainly reproduces the low-frequency audio signal LFE. The speakers 7L and 7R reproduce the medium- and high-frequency audio signals RL* and RR* in the rear left and right channels subjected to the virtual sound source processing.

It goes without saying that audio signals corresponding to the first to third speakers 6, 7L, and 7R may be supplied from the audio-signal output device unit 3 to the speakers through speaker cables without providing the audio-signal receiving and distributing unit 4.

As described above, with the audio reproduction system according to the first embodiment in which the multi-channel speakers are attached to the chair 20 shown in FIG. 5, the listener 5 sitting on the chair 20 can enjoy realistic multi-channel sound at large volume using speakers smaller in number than the number of channels. In addition, it is possible to substantially reduce sound leakage to the neighborhood.

In particular, in this embodiment, since the speaker 6 for bass reproduction is not housed in a box and is arranged near the listener 5 and near the ears behind the head, it is possible to substantially attenuate leakage of heavy bass to adjacent rooms. As described above, since the sound in the rear left and right channels is emitted as sound subjected to the virtual sound source processing by the speakers 7L and 7R near the ears of the listener 5, it is possible to reduce an audio signal level of the sound. Therefore, it is possible to further reduce levels of leakage of not only bass but also sound to the neighborhood. Consequently, it is possible to even enjoy, for example, DVD entertainment late at night at sufficient volume without worrying about others.

Since the speakers 6, 7L, and 7R are arranged near the ears of the listener, in an extreme case, audio signal output power can be set to about 1/100 of that in the past. Therefore, it is possible to save energy and substantially reduce cost of hardware (output amplifiers). There is also an advantage that, since only small power is necessary as audio output power, thin, light, and inexpensive speakers that do not need a large stroke can be used. Since the audio output power is reduced, heat generation decreases and a reduction in sizes of devices such as a power supply can also be performed. Therefore, battery driving is also possible and the speakers can be embedded in a design of a chair and the like.

Therefore, it is possible to realize energy saving for the audio reproduction system as a whole. There is an advantage that it is possible to provide an audio reproduction system that reduces noise to the neighborhood without deteriorating a degree of satisfaction of a person who enjoys sound.

In a normal noise insulation window, even if the noise insulation window has performance for reducing 45 dB at 5 kHz, the performance falls to 36 dB at 1 kHz and 20 dB at 100 Hz. At frequencies equal to or lower than 50 Hz, a noise insulation effect of the subwoofer according to this embodiment is extremely high. Therefore, assuming that a listener enjoys video audio reproduction by even performing noise insulation work, an effect of cost saving is extremely large.

In the explanation of the first embodiment, during the play of the DVD player 2, the audio signal Au2 is supplied to the speakers 11FL and 11FR of the television receiver 1 via the audio-signal output device unit 3. However, it is also possible that the audio signal Au2 from the DVD player 2 is supplied to the television receiver 1 and, as in the reception of a digital broadcast program, sound obtained by mixing sounds in the 5.1 channel is emitted from the speakers 11FL and 11FR. In that case, audio signal paths for supplying sound from the audio-signal output device unit 3 to the speakers 11FL and 11FR of the television receiver 1 are unnecessary.

The audio-signal receiving and distributing unit can be provided in a predetermined position such as below a seating surface of the chair 20.

The audio-signal output device unit 3 can receive the audio signal Au2 from supply sources of a multi-channel audio signal such as the television receiver 1 and the DVD player 2 through signal cables. However, in this case, it is necessary to connect the television receiver 1 and the DVD player 2 to the chair.

Therefore, a unit configured to transmit a multi-channel audio signal by radio using radio waves and light is provided in the DVD player 2 and the like and a receiving unit that receives the multi-channel audio signal transmitted by radio is provided in the audio-signal output device unit 3. This makes it unnecessary to provide the signal cables to the DVD player 2 and the like.

When an audio signal output from the supply source of a multi-channel audio signal such as the DVD player 2 is transmitted by radio waves and light in this way, the DVD player 2 and the like and the audio reproduction system are connected cordlessly. There is an advantage that, for example, the chair 20 equipped with the audio reproduction system can feely move.

In the above explanation, the speaker of the television receiver 1 is used as a front speaker. However, it goes without saying that a dedicated front speaker may be separately provided. In that case, a speaker for the center channel may also be provided.

In the embodiment, sounds in the left and right front channels and the center channel are reproduced using the speakers 11FL and 11FR of the television receiver 1. However, it is also possible that audio signals in the left and right front channels and the center channel is subjected to the virtual sound source processing and medium- and high-frequency components of the audio signal are supplied to the speakers 7L and 7R.

In that case, audio signals to the speakers 11FL and 11FR of the television receiver 1 are muted. In other words, for example, when the audio-signal output device unit 3 and the audio-signal receiving and distributing unit 4 are turned on by a remote controller, in the television receiver 1, it is advisable to control the audio signals to the speakers 11FL and 11FR to be muted.

Second Embodiment

In the first embodiment, a listener sits on a chair and enjoys 5.1-channel surround sound while looking at a display screen in a room. On the other hand, a second embodiment of the present invention is an example in reproducing and enjoying music in an automobile.

In the second embodiment, as in the first embodiment, 5.1-channel surround sound can be reproduced. However, in the second embodiment, sounds in all surround sound channels in the 5.1 channel are emitted by the three speakers 6, 7L, and 7R provided near the listener 5 to make it possible to maximize the effect of noise reduction and energy saving.

In the second embodiment, a listener who is driving an automobile and a listener in, for example, the seat next to the driver are allowed to enjoy 5.1-channel surround sound in optimum environments for the listeners.

Figure 10:
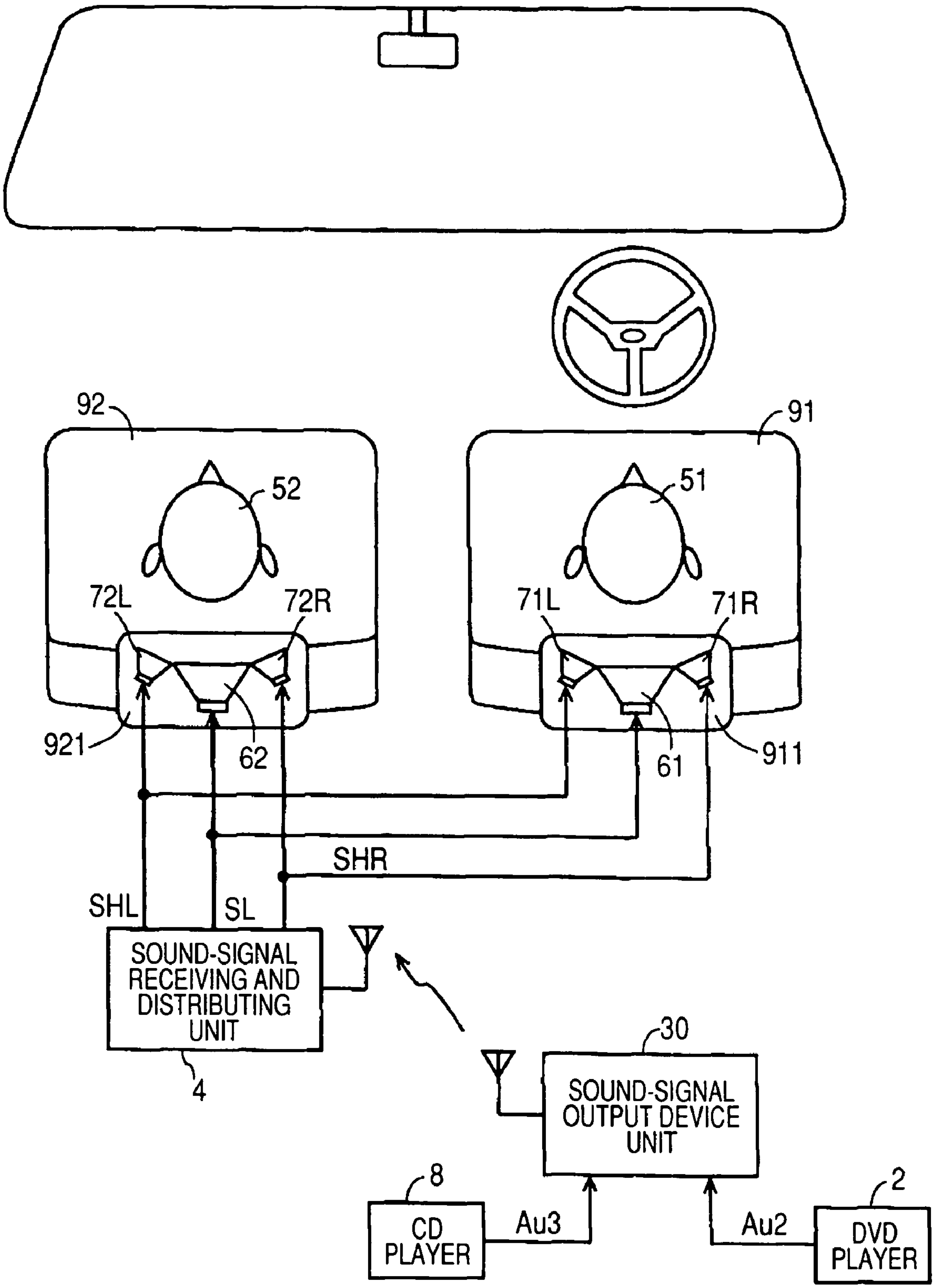
FIG. 10 is a diagram for explaining an example of the schematic structure of an audio reproduction system according to a second embodiment of the present invention.

FIG. 10 is a diagram schematically showing an audio reproduction system according to the second embodiment. In FIG. 10, components identical with those in the first embodiment are denoted by the identical reference numerals and signs. Detailed explanation of the components is omitted.

In the second embodiment, as shown in FIG. 10, the three speakers described above are arranged in each of a driver's seat 91 and a seat next to the driver 92. In this example, for a listener 51 who sits on the driver's seat 91, in a headrest 911 of the driver's seat 91, a speaker 61 for low-frequencies is arranged behind the center of the head of the listener 51 and speakers 71L and 72R for medium and high frequencies are arranged on both left and right side of the speaker 61.

In this example, for a listener 52 who sits on the seat next to the driver 92, in a headrest 921 of the seat next to the driver 92, a speaker 62 for low frequencies is arranged behind the center of the head of the listener 52 and speakers 72L and 72R for medium and high frequencies are arranged on both left and right sides of the speaker 62.

The speakers 61 and 62 for low frequencies are bare speakers having the same structure as the speaker 6 according to the first embodiment. The speakers 71L and 71R and the speakers 71L and 72R for medium and high frequencies have the structure same as the speakers 7L and 7R according to the first embodiment, respectively. In this embodiment, the speakers 71L and 71R and the speakers 71L and 72R are bare speakers. However, as in the first embodiment, the speakers 71L and 71R and the speakers 71L and 72R for medium and high frequencies may be attached to baffle plates and housed in speaker boxes rather than being formed as bare speakers.

As shown in FIG. 10, in the second embodiment, an audio-signal output device unit 30 is provided instead of the audio-signal output device unit 3 according to the first embodiment. As described later, the audio-signal output device unit 30 is different from the audio-signal output device unit 3 according to the first embodiment in that the audio-signal output device unit 30 subjects audio signals in the front left and right channels to the virtual sound source processing as well and generates signals in two channels transmitted to the audio-signal receiving and distributing unit 4.

In the second embodiment, the audio signal Au2 from the DVD player 2 and an audio signal Au3 from a CD (Compact Disc) player 8 are supplied to the audio-signal output device unit 30. The audio signal Au2 from the DVD player 2 is 5.1-channel surround sound in some case. However, the audio signal Au3 from the CD player 8 is an audio signal in the left and right two channels.

When the audio signals in the left and right two channels are inputted from the DVD player 2 or the CD player 8, as described later, the audio-signal output device unit 30 according to the second embodiment applies the virtual sound source processing to the audio signals in the front left and right two channels, generates audio signals in two channels transmitted to the audio-signal receiving and distributing unit 4, and transmits the audio signals to the audio-signal receiving and distributing unit 4.

As explained in the first embodiment, the audio-signal receiving and distributing unit 4 decodes a received signal into audio signals in two channels, separates low-frequency components and medium- and high-frequency components in the left and right two channels from the audio signals in the two channels, and generates signals supplied to the three speakers 61, 71L, and 71R and the three speakers 62, 72L, and 72R, respectively.

A low-frequency component SL generated by combining the low-frequency components SLL and SLR from the audio-signal receiving and distributing unit 4 is supplied to the speaker 61 for low-frequencies of the driver's seat 91 and supplied to the speaker 62 for low frequencies of the seat next to the driver 92.

The medium- and high-frequency component SHL in the left channel from the audio-signal receiving and distributing unit 4 is supplied to the speaker 71L for medium and high frequencies for the left channel of the driver's seat 91 and supplied to the speaker 72L for medium and high frequencies for the left channel of the seat next to the driver 92. The medium- and high-frequency component SHR in the right channel is supplied to the speaker 71R for medium and high frequencies for the right channel of the driver's seat 91 and supplied to the speaker 72R for medium and high frequencies for the right channel of the seat next to the driver 92.

Two audio-signal receiving and distributing units 4 for the driver's seat 91 and the seat next to the driver 92 may be provided, receive signals from the audio-signal output device unit 30, and generate audio signals supplied to the speakers 61, 71L, and 71R and the speakers 62, 72L, and 72R.

It goes without saying that the audio-signal output device unit 30 and the audio-signal receiving and distributing unit 4 may be connected by wire (cable) as a wire harness instead of radio transmission and reception.

Example of a Speaker Arrangement According to the Second Embodiment.

In the second embodiment, the three speakers are attached to a seat of an automobile. Several examples of a method of attaching the speakers are explained.

Figure 11:
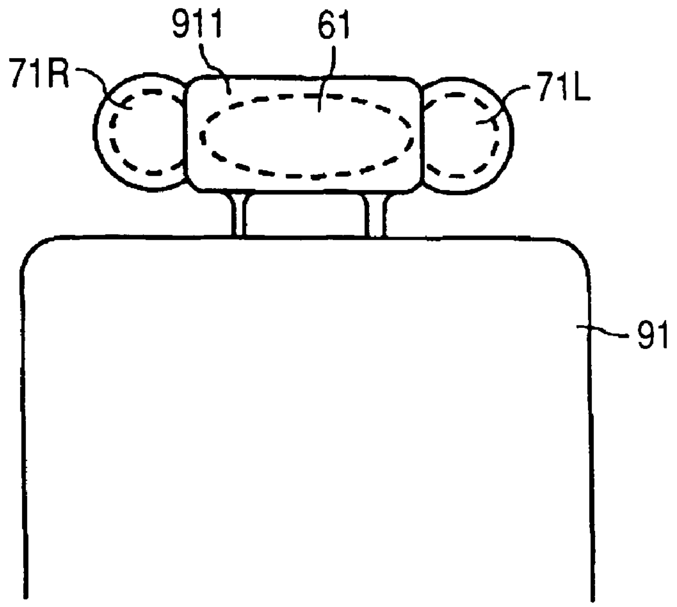
FIG. 11 is a diagram for explaining an example of a speaker arrangement in the audio reproduction system according to the second embodiment.

FIG. 11 is a diagram of a first example of a speaker attachment and arrangement. FIG. 11 shows an example of a speaker attachment and arrangement in the driver's seat 91. However, the same holds true for the seat next to the driver.

In this example, the headrest 911 is usually attached to the seat 91 of the automobile. Therefore, the speaker 61 for low frequencies is attached in the headrest 911 without being attached to a baffle plate. In the example shown in FIG. 11, the speakers 71L and 71R for medium and high frequencies in the left and right two channels are attached to the left and right ends of the headrest 911 without being attached to baffle plates.

However, if the speakers are attached as in the example shown in FIG. 11, although there is no problem in the seat next to the driver 92, in the driver's seat 91, when a driver turns the neck around to check the rear in moving the automobile backward, positions of the speakers 71L and 71R for medium and high frequencies in the left and right two channels interfere with the driver's sight.

Figure 12:
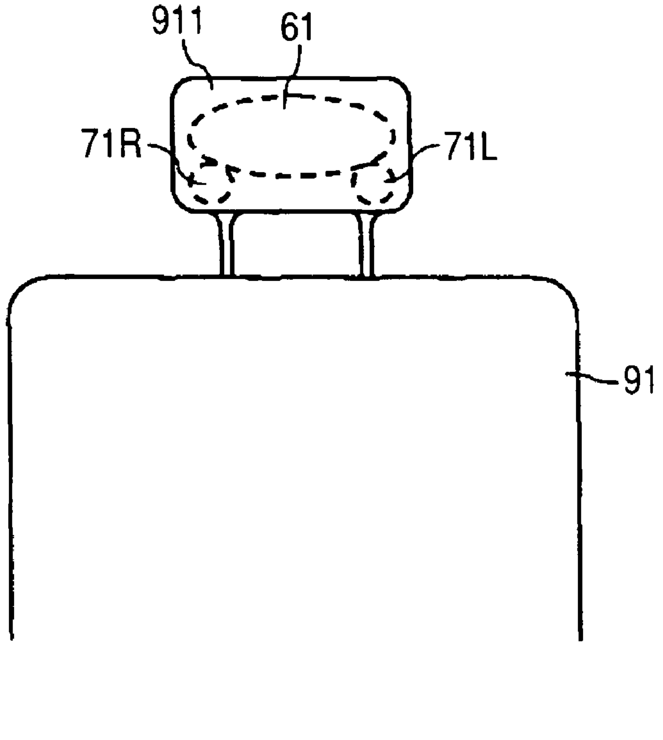
FIG. 12 is a diagram for explaining an example of a speaker arrangement in the audio reproduction system according to the second embodiment.

An example shown in FIG. 12 is an example in which this problem is solved. In the example shown in FIG. 12, the speakers 71L and 71R for medium and high frequencies are housed in a space in the headrest 911. Since relatively small speaker units can be used for the speakers 71L and 71R for medium and high frequencies, the structure shown in FIG. 12 can be realized relatively easily.

Figure 13A:
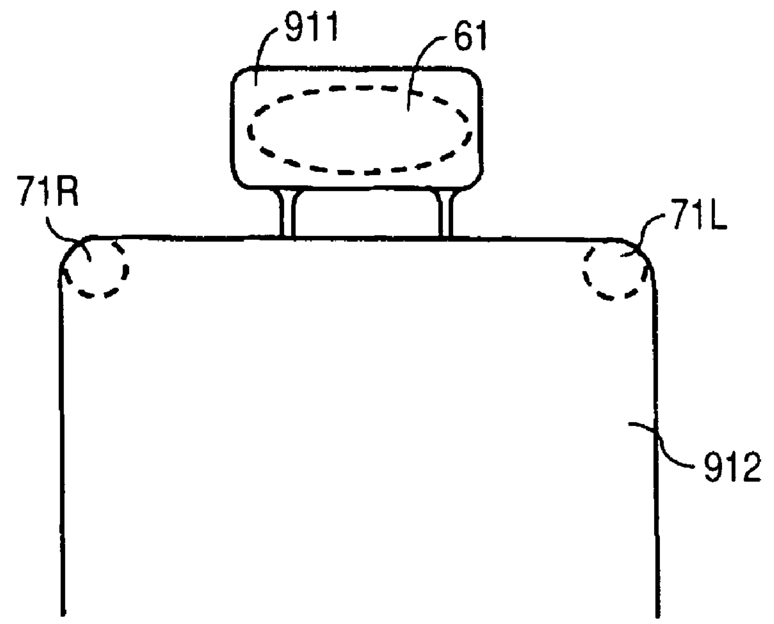
FIGS. 13A and 13B are diagrams for explaining an example of a speaker arrangement in the audio reproduction system according to the second embodiment.
Figure 13B:
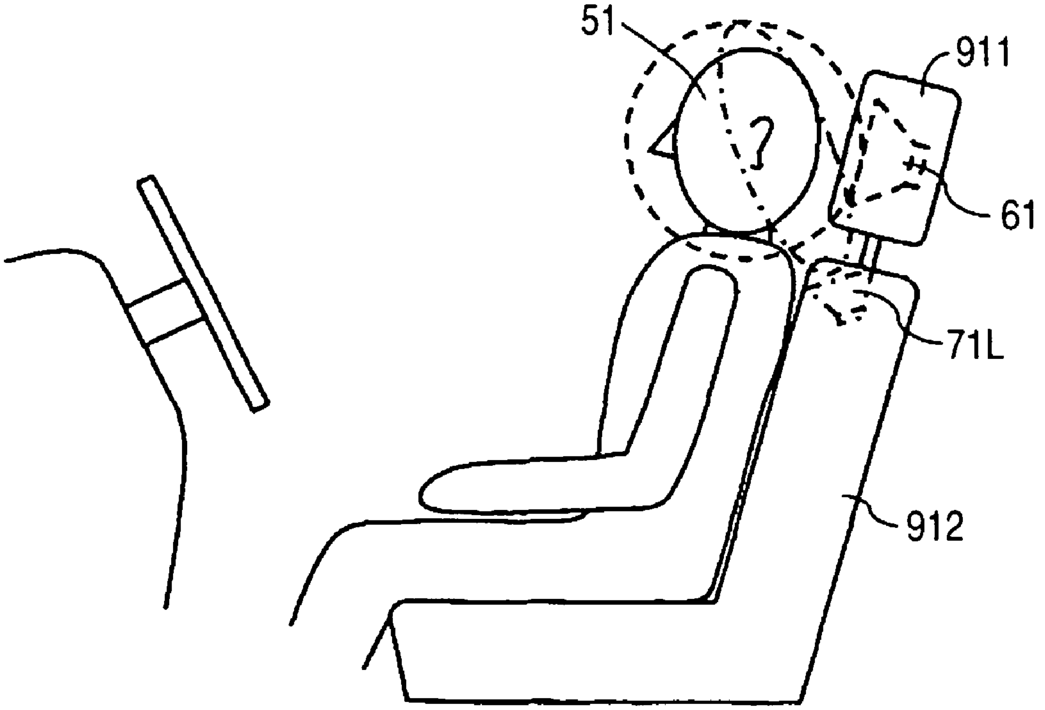

An example shown in FIGS. 13A and 13B is also an example in which the problem of the example shown in FIG. 11 is improved. In the example shown in FIGS. 13A and 13B, the speaker 61 for low frequencies is attached in the headrest 911 without being attached to a baffle plate. The speakers 71L and 71R for medium and high frequencies are attached to both left and right shoulder sections at the top of the chair back 912 of the seat without being attached to baffle plates. In this case, as shown in FIG. 13B, the speakers 71L and 71R for medium and high frequencies are attached such that directions of the ears of the listener 51 are in emitting directions of sound waves.

Example of the Structure of the Audio-Signal Output Device Unit 3 According to the Second Embodiment.

Figure 14:
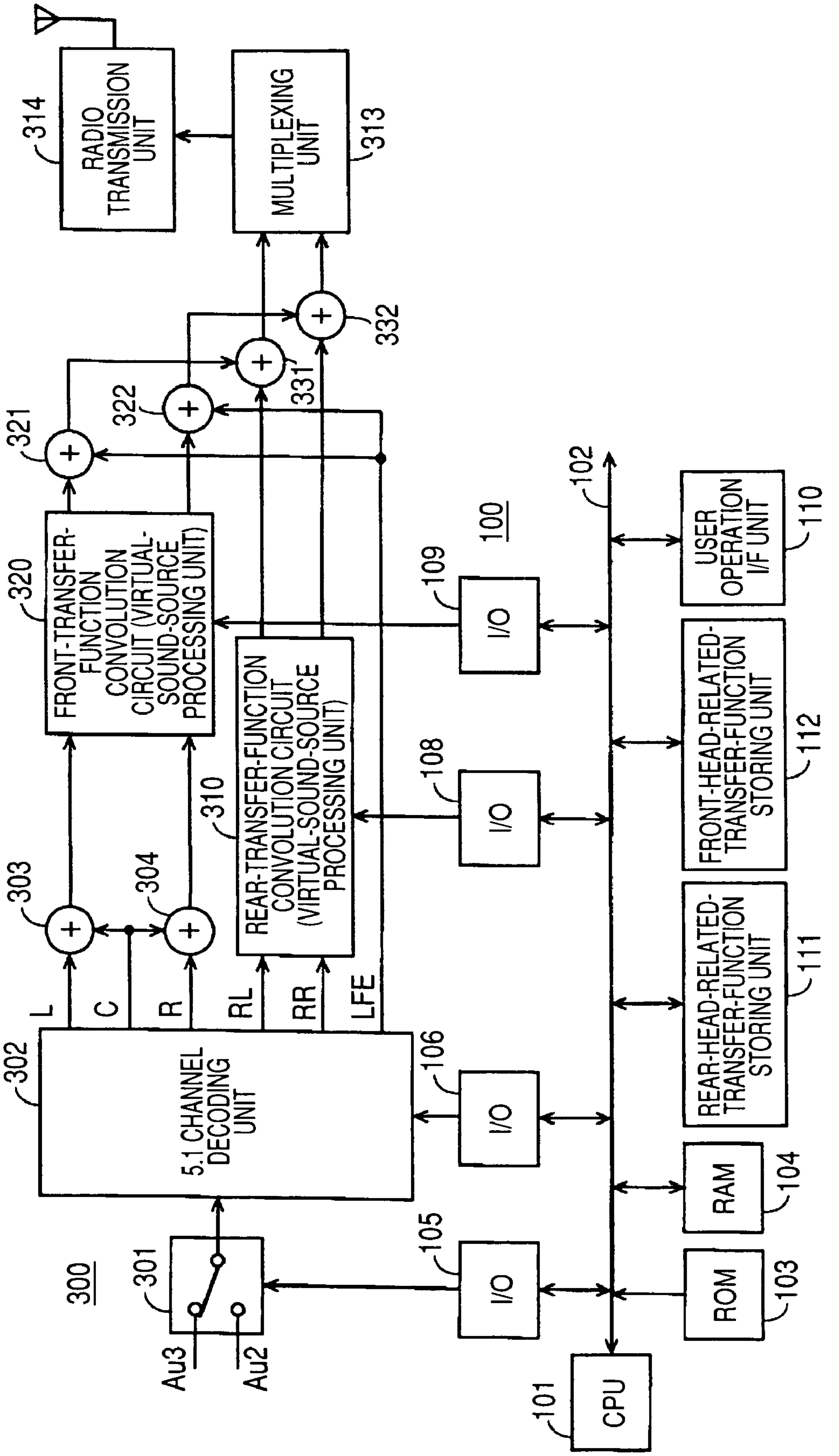
FIG. 14 is a block diagram showing an example of the structure of an audio-signal output device unit in the audio reproduction system according to the second embodiment.

FIG. 14 is a block diagram showing an example of the structure of the audio-signal output device unit 3 according to the second embodiment. Like the audio-signal output device unit 3 according to the second embodiment, the audio-signal output device unit 3 according to the second embodiment includes the audio-signal processing unit 300 and the control unit 100 including the microcomputer.

The control unit 100 according to the second embodiment is different from the control unit 100 according to the first embodiment in that the control unit 100 according to the second embodiment includes a front-head-related-transfer-function storing unit 112 in addition to the rear-head-related-transfer-function storing unit 111 and an input and output port 109 is added. Other components of the control unit 100 are substantially the same as those in the first embodiment.

In the audio-signal processing unit 300 according to the second embodiment, as in the first embodiment, the input selection switch circuit 301 is provided. However, in the second embodiment, the audio signal Au2 from the DVD player 2 and the audio signal Au3 from the CD player 8 are supplied to the input selection switch circuit 301. Anyone of the audio signals is obtained from the switch circuit 301 according to selection operation by a listener through the user operation interface 110.

In the audio-signal processing unit 300 according to the second embodiment, the 5.1-channel decoding unit 302 is provided. Further, besides the rear-transfer-function convolution circuit 310 according to the first embodiment, a front-transfer-function convolution circuit 320 is provided.

When the audio signal Au2 from the DVD player 2 is outputted from the switch circuit 301 and the 5.1 channel is selected by the user operation interface 110, the 5.1-channel decoding unit 302 performs channel decoding processing and outputs the audio signals L and R in the front left and right channels, the audio signal C in the center channels, the audio signals RL and RR in the rear left and right channels, and the low-frequency audio signal LFE.

The audio signal L in the front left channel and the audio signal C in the center channel from the 5.1-channel decoding unit 302 are combined by the combining unit 303. A combined output audio signal (L+C) of the audio signals is supplied to the front-transfer-function convolution circuit 320 that forms the virtual sound source processing unit. The audio signal R in the front right channel and the audio signal C in the center channel from the 5.1-channel decoding unit 302 are combined by the combining unit 304. A combined output audio signal (R+C) of the audio signals is supplied to the front-transfer-function convolution circuit 320.

The front-transfer-function convolution circuit 320 has the structure same as that of the rear-transfer-function convolution circuit 310. The front-transfer-function convolution circuit 320 convolutes, for example, using a digital filter, a front head related transfer function prepared in the front-head-related-transfer-function storing unit 115 in advance in the audio signals from the combining units 303 and 304.

Therefore, in the front-transfer-function convolution circuit 320, when an input audio signal thereto is not a digital signal, the input audio signal is converted into a digital signal. After the front head related transfer function is convoluted therein, the input audio signal is reset to an analog signal and outputted.

Figure 15:
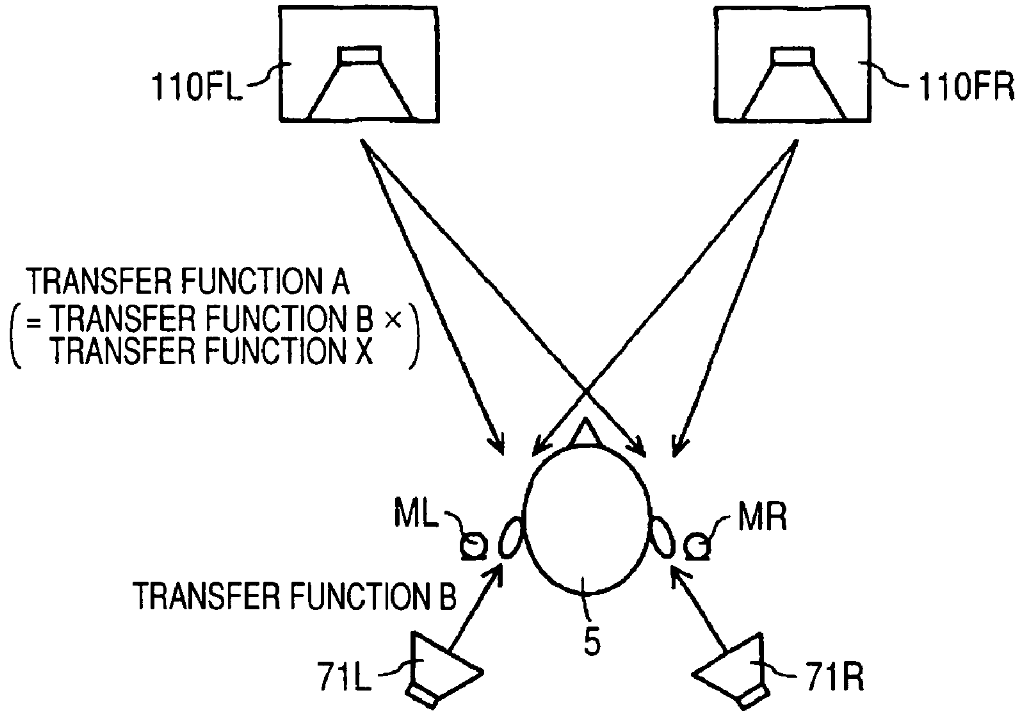
FIG. 15 is a diagram for explaining a front head related transfer characteristic used for virtual sound source processing.

In this example, the front head related transfer function is measured as described below and stored in the front-head-related-transfer-function storing unit 112. FIG. 15 is a diagram for explaining a method of measuring the front head related transfer function.

As shown in FIG. 15, the microphone ML for left channel measurement and the microphone MR for right channel measurement are set near both the left and right ears of the listener 5. A speaker 110FL for a front left channel is set in a place in front of the listener 5 where a speaker for the front left channel is usually arranged. For example, emitted sound emitted when impulse is reproduced by the speaker 110FL for the front left channel is collected by the respective microphones ML and MR. A transfer function for transfer from the front speaker 110FL to the left and right ears (a front head related transfer function for the front left channel) is measured from an audio signal of the collected sound.

In the same manner, for example, emitted sound emitted when impulse is reproduced by a speaker 110FR for a front right channel is collected by the respective microphones ML and MR. A transfer function for transfer from the front speaker 110FR to the left and right ears (a front head related transfer function for the front right channel) is measured from an audio signal of the collected sound.

It is advisable that, when the front speakers 110FL and 110FR are set in positions at an angle of 30 degrees and a distance of 2 m to the left and right from the center in front of the listener 5, a transfer function for transfer from the respective speakers to the ears is measured and the measured transfer function is applied as the front head related transfer function.

Explanation of the transfer function is further supplemented below. For example, in FIG. 15, a transfer function for transfer from left in front to the left ear is represented as a transfer function A. A transfer function obtained by measuring a transfer function for transfer from, for example, the speakers 71L and 71R near the ears to the microphone ML is represented as a transfer function B. A transfer function X, with which the transfer function B is multiplied to obtain the transfer function A, is calculated. The calculated transfer function X is convoluted in signal sound sent to the speaker 71L near the ears. Then, the listener 5 feels as if sound emitted from the speaker 71L at that point is sound traveling from a position 2 m left in front of the listener 5.

However, the transfer function X does not always have to be calculated. In some case, only the transfer function A has to be calculated. One transfer function is explained above as a representative transfer function. However, it goes without saying that, as shown in FIG. 15, actually, there are plural transfer functions.

The front head related transfer function measured as described above is stored in the front-head-related-transfer-function storing unit 112, supplied to the front-transfer-function convolution circuit 320 through the input and output port 109, and convoluted in the front-transfer-function convolution circuit 320.

An audio signal obtained by combining the audio signal C in the center channel with the audio signal FL* in the front left channel subjected to the virtual sound source processing and an audio signal obtained by combining the audio signal C in the center channel with the audio signal FR* in the front right channel subjected to the virtual sound source processing are obtained from the front-transfer-function convolution circuit 320.

Referring back to FIG. 10, the audio signals (FL*+C) and (FR*+C) from the front-transfer-function convolution circuit 320 are supplied to the speakers 71L and 71R or 72L and 72R arranged near both the ears of the listener 51 or 52 and reproduced. In this case, the listener 51 or 52 listens to reproduced sound as if the reproduced sound is emitted from the front speakers 11FL and 11FR in the front left and right and listens to center channel sound as if the center channel sound is emitted from the speaker set in the center.

Levels of the audio signals (FL*+C) and (FR*+C) at this point may be lower than levels of signals supplied to the speakers 110FL and 110FR. This is because the speakers 71L and 71R or 72L and 72R are near the ears of the listener 51 or 52.

In this way, the audio signals (FL*+C) and (FR*+C) from the front-transfer-function convolution circuit 320 subjected to the virtual sound source processing are supplied to combining units 321 and 322. The low-frequency audio signal LFE from the 5.1-channel decoding unit 302 is supplied to the combining units 321 and 322. Output audio signals of the combining units 321 and 322 are supplied to a combining unit 331 and a combining unit 332 through amplifiers 323 and 324.

As in the first embodiment, the audio signals RL and RR in the rear left and right two channels from the 5.1-channel decoding unit 302 are supplied to the rear-transfer-function convolution circuit 310 that forms the virtual sound source processing unit.

The rear head related transfer function measured as explained with reference to FIGS. 8A and 8B in the first embodiment is stored in the rear-head-related-transfer-function storing unit 111. The rear head related transfer function is read out from the rear-head-related-transfer-function storing unit 111, supplied to the rear-transfer-function convolution circuit 310 through the input and output port 108, and, in the rear-transfer-function convolution circuit 310, convoluted in the audio signals in the rear left and right two channels from the 5.1-channel decoding unit 302.

The audio signal in the front left channel, with which the audio signal in the center channel is combined, subjected to the virtual sound source processing from the front-transfer-function convolution circuit 320 is combined with the low-frequency audio signal LFE from the 5.1-channel decoding unit 302 in the combining unit 321. Then, the audio signal is supplied to the combining unit 331 and combined with the audio signal in the rear left channel subjected to the virtual sound source processing from the rear-transfer-function convolution circuit 310.

In the same manner, the audio signal in the front right channel, with which the audio signal in the center channel is combined, subjected to the virtual sound source processing from the front-transfer-function convolution circuit 320 is combined with the low-frequency audio signal LFE from the 5.1-channel decoding unit 302 in the combining unit 322. Then, the audio signal is supplied to the combining unit 322 and combined with the audio signal in the rear right channel subjected to the virtual sound source processing from the rear-transfer-function convolution circuit 310.

The combined audio signals from the combining units 331 and 332 are supplied to the multiplexing unit 313 and multiplexed and transmitted from the radio transmission unit 314 to the audio-signal receiving and distributing unit 4 by radio.

The audio-signal receiving and distributing unit 4 receives a radio wave from the audio-signal output device unit 3, extracts the multiplexed audio signal from the received radio wave, de-multiplexes the audio signal, and separates the audio signals for the left and right two channels. The audio-signal receiving and distributing unit 4 generates, from the audio signals for the left and right two channels, a signal SL supplied to the speakers 61 and 62 for low frequencies and signals SHL and SHR supplied to the speakers 71L and 71R and the speakers 72L and 72R for medium and high frequencies and supplies the signals to the speakers corresponding to the signals, respectively.

Therefore, the speakers 61 and 62 mainly reproduce the low-frequency audio signal LFE. The speakers 71L and 71R and the speakers 72L and 72R reproduces the front audio signals (FL*+C) and (FR*+C) subjected to the virtual sound source processing and the rear audio signals RL* and RR* subjected to the virtual sound source processing.

When audio signals in the left and right two channels from the CD player 8 are outputted from the switch circuit 301 or when an audio signal from the DVD players 2 is an audio signal in the left and right two channels, only the audio signals L and R in the left and right two channels are outputted from the 5.1-channel decoding unit 302 and supplied to the front-transfer-function convolution circuit 320. The front transfer function is convoluted in the audio signals and the audio signals are subjected to the virtual sound source processing. At this point, the rear-transfer-function convolution circuit 310 is not turned on and not actuated.

Signals in the two channels from the front-transfer-function convolution circuit 320 are supplied to the audio-signal receiving and distributing unit 4 by the multiplexing unit 313 and the radio transmission unit 314 through the combining units 321, 322, 331, and 332.

Therefore, at this point, audio signals obtained by subjecting the audio signals in the left and right front channels to the virtual sound source processing are reproduced in the speakers 61, 71L, and 71R or the speakers 62, 72L, and 72R as if reproduced sound is emitted from the front speakers placed on the left and right in front of the listener 51 or 52.

In this way, in the second embodiment, the listener 51 or 52 can enjoy realistic multi-channel sound at large volume using only the three speakers near both the ears of the listener 51 or 52 and behind the listener 51 or 52. Further, it is possible to substantially reduce leakage of sound to the neighborhood and realize energy saving for the audio reproduction system.

Reproduced sound fields are provided to the respective listeners 51 and 52. Therefore, there is an effect that, unlike reproduced sound fields provided by speakers fixedly set in a dashboard, doors, and the like of an automobile, audio image localization does not change depending on positions of listeners and optimum reproduced sound fields can be typically provided to the respective listeners.

As explained in the first embodiment as well, since acoustic power in the three speakers behind the head of the listener can be substantially reduced compared with that in arranging speakers in doors and the like in a vehicle-mounted audio system in the past, there is also an advantage that a load on a battery can be reduced.

In the second embodiment, audio signals in all channels of multi-surround sound are subjected to the virtual sound source processing and supplied to the three speakers near the listener 5 and behind the head. In the second embodiment, as in the past, for example, it is also possible that sounds in the left and right front channels are reproduced by speakers attached to a dashboard and doors of an automobile and audio signals obtained by subjecting an audio signal in the rear channel to the virtual sound source processing are reproduced by the three speakers behind the head.

Further, it is also possible that audio signals in all the channels in the 5.1 channel are subjected to the virtual sound source processing and reproduced by the three speakers behind the head and the center channel, in which localization is relatively difficult, is supplementarily provided by the speakers fixedly set in the dashboard, the doors, and the like of the automobile.

Other Embodiments and Modifications.

Figure 16:
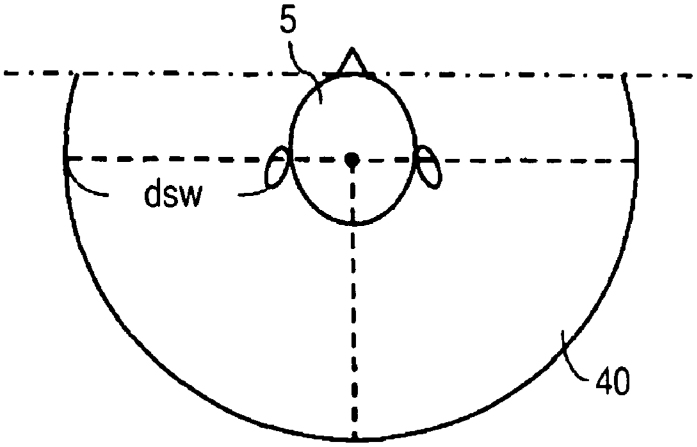
FIG. 16 is a diagram for explaining another speaker arrangement in an audio reproduction system according to an embodiment of the present invention.

Arrangement positions of the speaker for low frequencies and the two speakers for medium and high frequencies are not limited to the arrangement positions in the embodiments described above. For example, as shown in FIG. 16, the arrangement positions may be any positions as long as the positions are behind the listener 5 and on a spherical surface with a radius of, for example, (dsw+radius of the head of the listener 5) around the head of the listener 5. However, it is desirable that, as shown in FIG. 16, the arrangement positions of the speakers are within a section 40 further on the rear side than the face of the listener 5 to prevent the field of view of the listener 5 from being interfered.

As a method of attaching the speaker unit of the speaker for low frequencies to make it possible to mix sounds emitted from the front and rear of the vibration plate of the speaker is not limited to the structure for attaching the speaker unit to the pipe as explained in the embodiments described above. For example, it is also possible that the speaker unit for low frequencies is attached to a plate in which a large number of relatively large holes are drilled and sounds emitted from the front and rear of the vibration plate can be mixed through the large number of holes.

In the embodiments described above, the speaker for low frequencies and the speakers for medium and high frequencies are fixed and attached to the chair. However, a method of holding these speakers is not limited to this. For example, each of the speakers may be held in a form of a stand placed on a floor or may be suspended from a ceiling.

Objects subjected to the virtual sound source processing are the audio signals in the rear left and right two channels in the first embodiment and the audio signals in the rear left and right two channels, the front left and right two channels, and the center channel in the second embodiment. However, the sounds in the rear left and right two channels may be reproduced by an actual speaker and the sounds in the front left and right two channels and the center channel may be subjected to the virtual sound source processing.

In the explanation of the embodiments, the audio reproduction system that reproduces the multi-channel audio signal in the 5.1 channel is explained. However, the present invention is applicable to all audio reproduction systems that reproduce audio signals in not only the 5.1 channel but also two or more channels.

It goes without saying that audio signals not subjected to the virtual sound source processing described above may be supplied to the speaker for low frequencies and the speakers for medium and high frequencies. In other words, stereo audio signals in the left and right two channels may be inputted to the audio-signal receiving and distributing unit.

It should be understood by those skilled in the art that various modifications, combinations, sub-combinations, and alterations may occur depending on design requirements and other factors insofar as they are within the scope of the appended claims or the equivalents thereof.

What is claimed is:

1. An audio reproduction system comprising:

a single first speaker arranged to be located near a listener and directly behind a head of the listener with a speaker unit being held by first holding means to make it possible to mix sounds emitted from front and rear of a vibration plate of the speaker;

second and third speakers held by second holding means and arranged to be located near the listener and on left and right of the single first speaker;

separating means for separating, from an input audio signal, low-frequency components and medium- and high-frequency components for left and right channels;

means for supplying the low-frequency components separated by the separating means to the single first speaker; and means for supplying the medium-and high-frequency components for the left and right channels separated by the separating means to the second and third speakers.

2. An audio reproduction system according to claim 1, wherein the input audio signal is a combined input audio signal for the left and right channels, and the separating means separates the low-frequency components and the medium- and high-frequency components from the input audio signal for the left and right channels and combines the separated low-frequency components for the left and right channels to obtain low-frequency components supplied to the single first speaker.

3. An audio reproduction system according to claim 2, wherein the input audio signal for the left and right channels is subjected to virtual sound source processing employing a head related transfer function such that, when sound is reproduced by at least the second and third speakers, the listener listens to the sound as if the reproduced sound is emitted from other speakers in positions different from positions of the second and third speakers.

4. An audio reproduction system according to claim 2, wherein the audio reproduction system reproduces multi-channel surround sound, and the input audio signal is obtained by subjecting a front-channel signal in the multi-channel surround sound to virtual sound source processing such that, when the front-channel audio signal is reproduced by the second and third speakers, the listener listens to reproduced sound as if the reproduced sound is emitted from a speaker arranged in front of the listener.

5. An audio reproduction system according to claim 2, wherein the audio reproduction system reproduces multi-channel surround sound, and the input audio signal is obtained by subjecting a rear-channel audio signal in the multi-channel surround sound to virtual sound source processing such that, when the rear-channel audio signal is reproduced by the second and third speakers, the listener listens to reproduced sound as if the reproduced sound is emitted from a speaker arranged behind the listener.

6. An audio reproduction system according to claim 2, wherein the audio reproduction system reproduces multi-channel surround sound, and the input audio signal is obtained by subjecting a front-channel audio signal in the multi-channel surround sound to virtual sound source processing such that, when the front-channel audio signal is reproduced by the second and third speakers, the listener listens to reproduced sound as if the reproduced sound is emitted from a speaker arranged in front of the listener and subjecting an audio signal in a rear channel in the multi-channel surround sound to the virtual sound source processing such that, when the rear-channel audio signal is reproduced by the two speakers, the listener listens to reproduced sound as if the reproduced sound is emitted from a speaker arranged behind the listener.

7. The audio reproduction system according to claim 1, wherein only the low frequency components are supplied to the single first speaker and only the medium- and high-frequency components are supplied to the second and third speakers.

8. The audio reproduction system according to claim 7, wherein no other speakers are arranged to be located near the listener.

9. The audio reproduction system according to claim 7, wherein the first speaker, second speaker and third speaker are arranged to be located within about 20 cm from the head of the listener.

10. An audio reproduction system according to claim 1, wherein the first speaker and the second and third speakers are held by a holding unit attached to an upper part of a chair back of a chair on which the listener can sit.

11. An audio reproduction system according to claim 1, wherein the first speaker is held by a holding unit attached to an upper part of a chair back of a chair on which the listener can sit, and the second and third speakers are attached on left and right of the upper part of the chair back of the chair on which the listener can sit.

12. The audio reproduction system according to claim 1, wherein the low frequency components comprise frequencies less than about 200 Hz and the medium- and high-frequency components comprise frequencies greater than about 200 Hz.

13. The audio reproduction system according to claim 1, wherein the low frequency components comprise frequencies less than about 100 Hz and the medium- and high-frequency components comprise frequencies greater than about 100 Hz.

14. The audio reproduction system according to claim 1, wherein the single first speaker is centered between the second and third speakers.

15. The audio reproduction system according to claim 1, wherein the single first speaker is the only speaker supplied with the low-frequency components.

16. A speaker assembly comprising:

a single first speaker unit arranged to be located near and directly behind a head of a listener and held to make it possible to mix sounds emitted from front and rear of a vibration plate of the speaker; and second and third speaker units arranged on left and right of the single first speaker unit and located to be near the listener, wherein low-frequency components separated from an input audio signal are supplied to the single first speaker unit, and medium- and high-frequency components for left and right channels separated from the input audio signal are supplied to the second and third speaker units, respectively.

17. An audio reproduction system comprising:

a single first speaker arranged to be located near a listener and directly behind a head of the listener with a speaker unit being held by a first holding unit to make it possible to mix sounds emitted from front and rear of a vibration plate of the speaker;

second and third speakers held by a second holding unit and arranged to be located near the listener and on left and right of the single first speaker;

a separating unit configured to separate, from an input audio signal, low-frequency components and medium- and high-frequency components for left and right channels;

a first unit configured to supply the low-frequency components separated by the separating unit to the single first speaker; and a second unit configured to supply the medium- and high-frequency components for the left and right channels separated by the separating unit to the second and third speakers.

* * * * *